US008860016B2

(12) United States Patent
Suzuki

(10) Patent No.: US 8,860,016 B2
(45) Date of Patent: Oct. 14, 2014

(54) PHOTOELECTRIC CONVERSION DEVICE AND IMAGING DEVICE

(75) Inventor: Hideyuki Suzuki, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 199 days.

(21) Appl. No.: 13/638,648

(22) PCT Filed: Mar. 24, 2011

(86) PCT No.: PCT/JP2011/057250
§ 371 (c)(1),
(2), (4) Date: Oct. 1, 2012

(87) PCT Pub. No.: WO2011/125526
PCT Pub. Date: Oct. 13, 2011

(65) Prior Publication Data
US 2013/0020566 A1    Jan. 24, 2013

(30) Foreign Application Priority Data

Mar. 31, 2010  (JP) ................. 2010-084407
Nov. 5, 2010   (JP) ................. 2010-249209

(51) Int. Cl.
H01L 35/24 (2006.01)

(52) U.S. Cl.
USPC .................... 257/40; 257/E51.001

(58) Field of Classification Search
USPC .......................... 257/40, E51.001
See application file for complete search history.

(56) References Cited

U.S. PATENT DOCUMENTS

| 2007/0063156 | A1 | 3/2007 | Hayashi |
| 2009/0050881 | A1 | 2/2009 | Hayashi |
| 2009/0054641 | A1 | 2/2009 | Kitamura et al. |
| 2009/0223566 | A1 | 9/2009 | Mitsui et al. |
| 2011/0068254 | A1 | 3/2011 | Hayashi |
| 2012/0184730 | A1 | 7/2012 | Kitamura et al. |

FOREIGN PATENT DOCUMENTS

| JP | 2004165516 A | 6/2004 |
| JP | 200788033 A  | 4/2007 |
| JP | 2007123707 A | 5/2007 |
| JP | 200949278 A  | 3/2009 |
| JP | 200954606 A  | 3/2009 |

OTHER PUBLICATIONS

Office Action dated Nov. 27, 2012, issued by the Japanese Patent Office in counterpart Japanese Patent Application No. 2010-249209.

(Continued)

Primary Examiner — Anthony Ho
(74) Attorney, Agent, or Firm — Sughrue Mion, PLLC

(57) ABSTRACT

Provided is a solid-state imaging device using an organic photoelectric conversion device which functions as a photoelectric conversion device having high photoelectric conversion efficiency when applied to the photoelectric conversion device, having a small absolute value of a dark current, and exhibiting favorable characteristics at a room temperature to 60° C. The photoelectric conversion device includes a pair of electrodes, a photoelectric conversion layer interposed between the pair of electrodes, which is a bulk hetero layer where fullerene or a fullerene derivative and a p-type organic semiconductor material are mixed and having an ionization potential of from 5.2 eV to 5.6 eV, and at least one electron blocking layer between at least one electrode of the pair of electrodes and the photoelectric conversion layer, and the ionization potential of the electron blocking layer adjacent to the photoelectric conversion layer being higher than the ionization potential of the photoelectric conversion layer.

5 Claims, 2 Drawing Sheets

(56) References Cited

OTHER PUBLICATIONS

Communication dated Jan. 17, 2012 from the Japanese Patent Office in counterpart Japanese application No. 2010-249209.

Communication dated Jun. 7, 2011 from the Japanese Patent Office in counterpart Japanese application No. 2010-249209.

International Search Report dated Jun. 14, 2011 from the International Searching Authority in counterpart application No. PCT/JP2011/057520.

Written Opinion dated Jun. 14, 2011 from the International Searching Authority in counterpart application No. PCT/JP2011/057520.

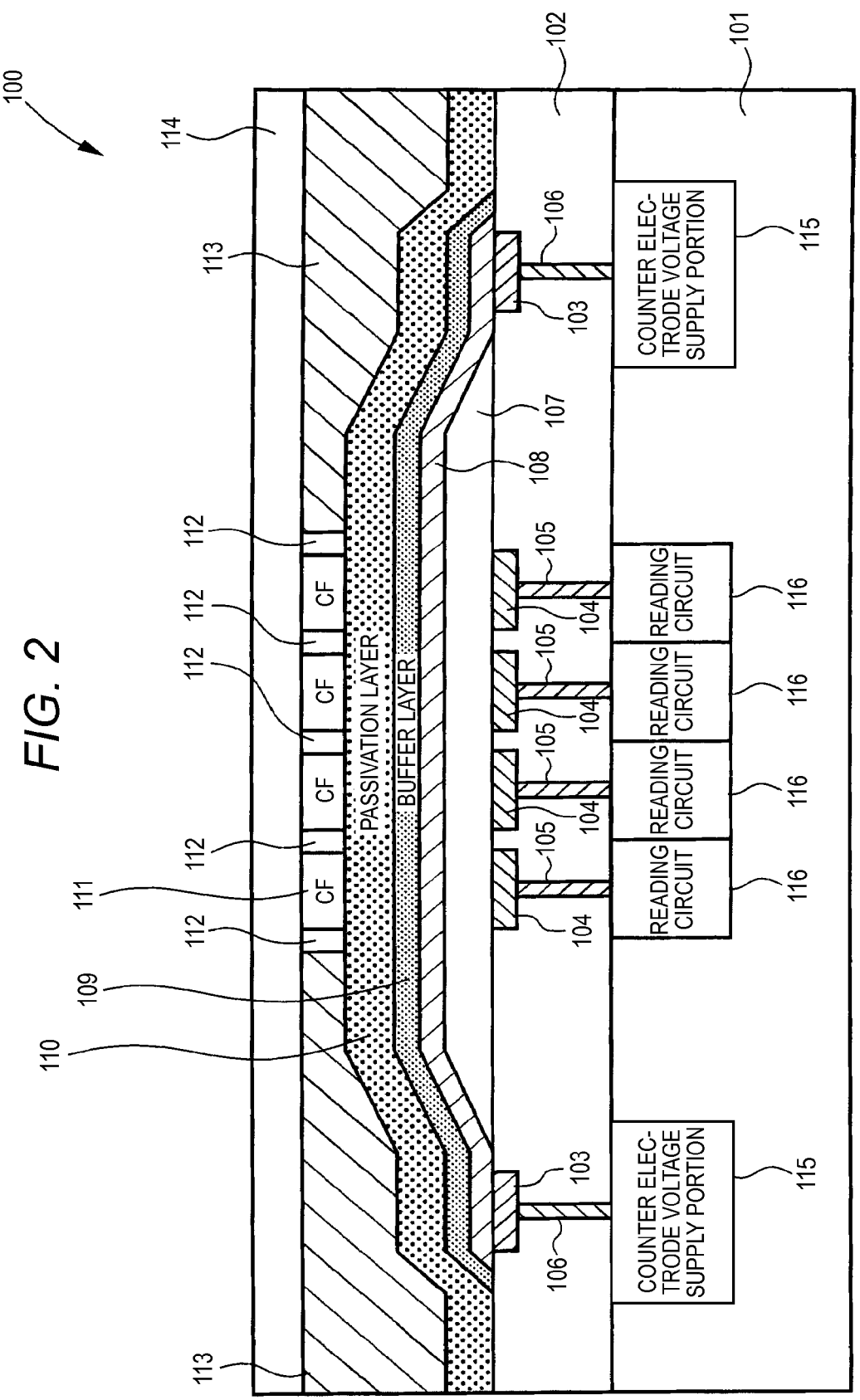

PHOTOELECTRIC CONVERSION DEVICE AND IMAGING DEVICE

TECHNICAL FIELD

The present invention relates to a photoelectric conversion device and an imaging device.

BACKGROUND ART

As a solid-state imaging device, a flat light receiving device is being widely used in which photoelectric conversion portions are two-dimensionally arranged in a semiconductor to form pixels, and a signal generated by a photoelectric conversion in each pixel is charge-transferred and read by a CCD circuit or a CMOS circuit. A thing which a photodiode portion using a PN junction is formed in a semiconductor such as Si is generally used as a conventional photoelectric conversion portion.

Recently, as the number of pixels is increased, a pixel size is reduced, and an area of a photodiode portion is reduced, raising a problem that an aperture ratio and light focusing efficiency are reduced, and as a result, the sensitivity is reduced. A solid-state imaging device having an organic photoelectric conversion film using an organic material is being examined as a method of improving an aperture ratio and the like.

A photoelectric conversion device using an organic compound and a solid-state imaging device using the photoelectric conversion device as a light receiving portion are developed. There is disclosed an organic photoelectric conversion device having a structure where a photoelectric conversion layer absorbing light to generate electric charges, and an electric charge blocking layer suppressing injection of electric charges from an electrode are stacked (Patent Document 1). The electron blocking layer having a function of suppressing injection of electrons from the electrode has electron affinity that is lower than a work function of the adjacent electrode by 1.3 eV or more, thereby suppressing injection of the electrons. In the related art, the ionization potential of the electron blocking layer is generally designed to be lower than the ionization potential of the photoelectric conversion layer adjacent thereto in order to efficiently extract a photocurrent. Patent Document 3 discloses a photoelectric conversion device where an ionization potential of an electron blocking layer is higher than the ionization potential of a photoelectric conversion layer adjacent thereto, but a dark current value is not sufficiently low, and sufficient S/N is not obtained. Further, Patent Document 3 does not disclose that the ionization potential of the photoelectric conversion layer is from 5.2 eV to 5.6 eV.

Further, in Patent Document 2, a layer where a p-type organic semiconductor and an n-type organic semiconductor are mixed is used as a photoelectric conversion layer (bulk hetero layer) in order to increase photoelectric conversion efficiency.

RELATED ART

Patent Document

Patent Document 1: Japanese Patent Application Laid-Open No. 2007-88033
Patent Document 2: Japanese Patent Application Laid-Open No. 2007-123707
Patent Document 3: Japanese Patent Application Laid-Open No. 2009-54606

DISCLOSURE OF INVENTION

Problems to be Solved by the Invention

There is a case where a solid-state imaging device is used at a high temperature of 50° C. or more. Accordingly, a photoelectric conversion device using an organic compound used in the solid-state imaging device is necessary to maintain performance thereof within the range of assumed temperatures. However, in a related art, temperature-dependent performance of the photoelectric conversion device has not been considered. After an actual examination, it was found out that there occurs a problem that a dark current of the photoelectric conversion device is largely increased with the increase of temperature, thus affecting an imaging characteristic of the solid-state imaging device.

The present invention has been made to improve the aforementioned problems, and provides a solid-state imaging device using an organic photoelectric conversion device serving as a photoelectric conversion device having high photoelectric conversion efficiency when applied to the photoelectric conversion device, having a low absolute value of a dark current, and exhibiting favorable characteristics at a temperature of room temperature to 60° C. Further, an organic photoelectric conversion device having sufficiently low temperature dependence of performance is provided.

Means for Solving the Problems

As a result of a close examination of the present invention, it was found out that the above object can be accomplished by configuring an organic photoelectric conversion device where an electron blocking layer and a photoelectric conversion layer are stacked on an electrode, in which the photoelectric conversion layer is a bulk hetero layer where a fullerene or a fullerene derivative and a p-type organic semiconductor material are mixed, an ionization potential of the photoelectric conversion layer is 5.2 to 5.6 eV, and the ionization potential of the electron blocking layer is designed to be higher than the ionization potential of the photoelectric conversion layer adjacent thereto.

That is, the above object may be solved by the following means.

[1] A photoelectric conversion device comprising:
   a pair of electrodes; and
   a photoelectric conversion layer interposed between the pair of electrodes,
   wherein the photoelectric conversion layer is a bulk hetero layer where a fullerene or a fullerene derivative and a p-type organic semiconductor material are mixed,
   an ionization potential of the photoelectric conversion layer is 5.2 eV to 5.6 eV,
   at least one electron blocking layer is provided between at least one of the pair of electrodes and the photoelectric conversion layer, and
   the ionization potential of the electron blocking layer adjacent to the photoelectric conversion layer is higher than the ionization potential of the photoelectric conversion layer.

[2] The photoelectric conversion device according to [1],
   wherein the p-type organic semiconductor material is a compound represented by the following Formula (1):

[Chem. 1]

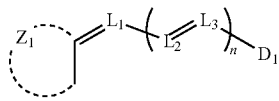

Formula (1)

wherein $Z_1$ is a ring including at least two carbon atoms and represents a 5-membered ring, a 6-membered ring, or a condensed ring including at least one of the 5-membered ring and the 6-membered ring, each of $L_1$, $L_2$ and $L_3$ independently represents a unsubstituted methine group or a substituted methine group, $D_1$ represents an atom group, n represents an integer of 0 or more.

[3] The photoelectric conversion device according to [1] or [2], wherein the pair of electrodes include a conductive film and a transparent conductive film, and the conductive film, the electron blocking layer, the photoelectric conversion layer and the transparent conductive film are stacked in this order.

[4] A photosensor comprising:

the photoelectric conversion device according to any one of [1] to [3].

[5] An imaging device comprising:

the photoelectric conversion device according to any one of [1] to [3].

Effects of Invention

According to the present invention, there may be provided a photoelectric conversion device serving as a photoelectric conversion device having high photoelectric conversion efficiency, exhibiting a low dark current, having excellent light resistance, and capable of reducing an increase of a dark current caused by an increase in temperature, and an imaging device including the photoelectric conversion device.

BRIEF DESCRIPTION OF THE DRAWINGS

FIG. 2 is a cross-sectional view schematically illustrating the constitution of an imaging device for describing an embodiment of the present invention.

EMBODIMENTS FOR CARRYING OUT THE INVENTION

Figure 1:
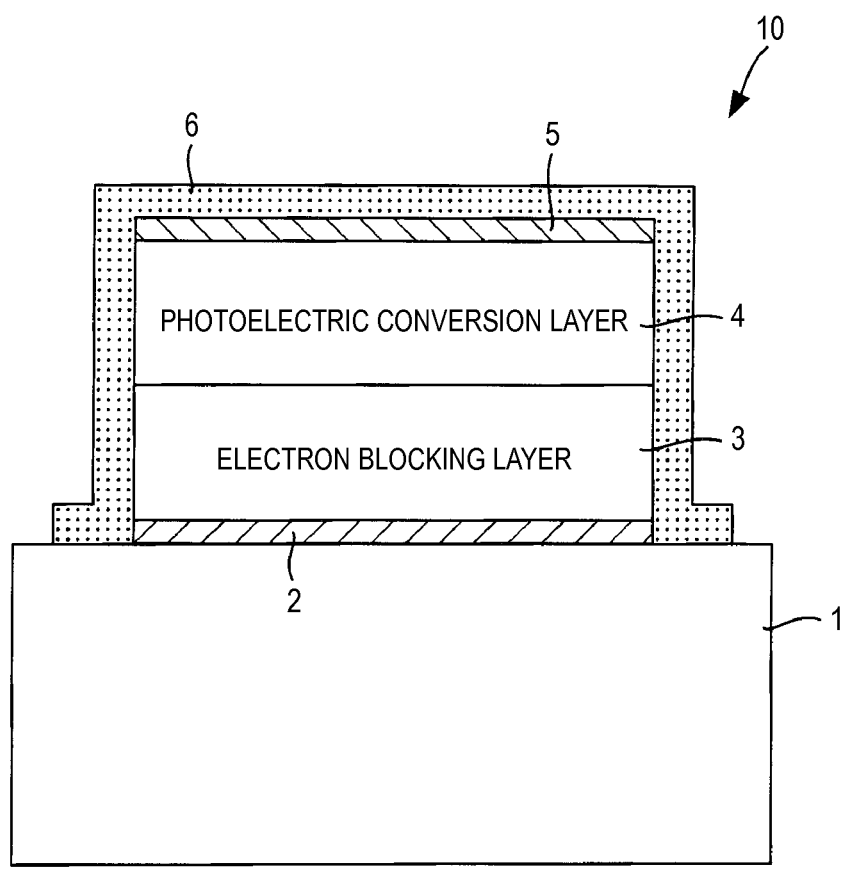
FIG. 1 is a cross-sectional view schematically illustrating the constitution of an organic photoelectric conversion device for describing an embodiment of the present invention.

A photoelectric conversion device of the present invention is a photoelectric conversion device including a photoelectric conversion layer interposed between a transparent conductive film and a conductive film, in which the photoelectric conversion layer is a bulk hetero layer where a fullerene or a fullerene derivative and a p-type organic semiconductor material are mixed, an ionization potential of the photoelectric conversion layer is 5.2 to 5.6 eV, at least one electron blocking layer is provided between one electrode of a pair of electrodes and the photoelectric conversion layer, and the ionization potential of the electron blocking layer adjacent to the photoelectric conversion layer is higher than the ionization potential of the photoelectric conversion layer. High photoelectric conversion efficiency may be obtained, and the generation of dark current derived from the photoelectric conversion layer may be suppressed by using the photoelectric conversion layer as the bulk hetero layer having the ionization potential of 5.2 eV to 5.6 eV. By having a higher ionization potential of the electric charge blocking layer adjacent to the photoelectric conversion than the ionization potential of the photoelectric conversion layer, it is possible to exhibit an effect of suppressing the generation of dark current at an interface between the electron blocking layer and the photoelectric conversion layer.

As an embodiment of the photoelectric conversion device of the present invention, the photoelectric conversion device includes a pair of electrodes and a photoelectric conversion layer interposed between the pair of electrodes, in which the temperature dependence of dark current of the photoelectric conversion device is preferably 50 pA/(cm²×5° C.) or less in a temperature range of 70° C. or less, and more preferably 10 pA/(cm²×5° C.) or less. If the temperature dependence of dark current is within the range, it is possible to prevent deterioration of performance when the device is used at high temperatures.

As another exemplary embodiment of the photoelectric conversion device of the present invention, the photoelectric conversion device includes a pair of electrodes and a photoelectric conversion layer interposed between the pair of electrodes, in which a difference between a dark current value of the photoelectric conversion device at 65° C. and a dark current value of the photoelectric conversion device at 60° C. is more preferably 50 pA/(cm²×5° C.) or less, and even more preferably 10 pA/(cm²×5° C.) or less.

The value of dark current was measured by using a 6430-type source meter manufactured by KEITHLEY, Co., Ltd., and applying bias to the light-shielded photoelectric conversion device. Further, the temperature dependence was measured by heating the device by a block heater.

Further, as another embodiment of the photoelectric conversion device of the present invention, the dark current at 30° C. is preferably 100 pA/cm² or less, and more preferably 10 pA/cm². When the dark current at 30° C. is 100 pA/cm² or less, and the imaging device is manufactured by using the photoelectric conversion device, it is possible to exhibit an effect that noise caused by the photoelectric conversion device does not affect imaging characteristics.

Hereinafter, preferable embodiments of the photoelectric conversion device according to the present invention will be described. The photoelectric conversion device according to the present invention may be constituted so that a pair of electrodes include a conductive film and a transparent conductive film, and the conductive film, the photoelectric conversion layer, the electron blocking layer and the transparent conductive film are stacked in this order, but in a preferable aspect thereof, the conductive film, the electron blocking layer, the photoelectric conversion layer and the transparent conductive film are stacked in this order.

FIG. 1 is a cross-sectional view schematically illustrating the constitution of the organic photoelectric conversion device for describing an embodiment of the present invention. An organic photoelectric conversion device 10 shown in FIG. 1 includes a substrate 1, an electrode 2 formed on the substrate 1, an electron blocking layer 3 formed on the electrode 2, a photoelectric conversion layer 4 formed on the electron blocking layer 3, an electrode 5 formed on the photoelectric conversion layer 4, and a passivation layer 6 formed on the electrode 5.

The substrate 1 is a silicon substrate, a glass substrate or the like.

The electrode 2 is an electrode for collecting holes of electric charges generated in the photoelectric conversion layer 4. The electrode 2 is constituted by a conductive material such as ITO (indium tin oxide) or TiN (titanium nitride), or the like.

The photoelectric conversion layer 4 receives light to generate electric charges according to a quantity of light thereof, and includes an organic photoelectric conversion material. Specifically, the photoelectric conversion layer 4 may be a layer having a bulk hetero structure where a p-type organic semiconductor (p-type organic compound) and a fullerene or a fullerene derivative that is an n-type organic semiconductor are mixed.

The electron blocking layer 3 is a layer for suppressing injection of electrons from the electrode 2 into the photoelectric conversion layer 4. The electron blocking layer 3 includes an organic material, an inorganic material, or both of the materials.

The electrode 5 is an electrode for collecting electrons of electric charges generated in the photoelectric conversion layer 4. The electrode 5 uses a conductive material (for example, ITO) sufficiently transparent to light having a wavelength at which the photoelectric conversion layer 4 has sensitivity in order to allow light to be incident on the photoelectric conversion layer 4. Holes of electric charges generated in the photoelectric conversion layer 4 may be moved to the electrode 2, and electrons thereof may be moved to the electrode 5 by applying a bias voltage between the electrode 5 and the electrode 2.

The passivation layer 6 is a layer for preventing factors deteriorating organic materials such as water and oxygen from permeating the photoelectric conversion layer 4 including the organic materials. The passivation layer 6 is formed to cover the electrode 2, the electron blocking layer 3, the photoelectric conversion layer 4 and the electrode 5.

In the organic photoelectric conversion device 10 constituted as described above, the electrode 5 is used as an electrode of a light incidence side, and when light is incident from an upper side of the electrode 5, the light permeates the electrode 5 and is incident on the photoelectric conversion layer 4, thus generating electric charges therein. The holes of the generated electric charges move to the electrode 2. The holes moved to the electrode 2 are converted into a voltage signal according to a quantity thereof to be read, thereby making it possible to convert light into a voltage signal and extract it.

Further, the electron blocking layer 3 may be constituted by a plurality of layers. Thereby, an interface is formed between each of the layers constituting the electron blocking layer 3, causing discontinuity at a mid-level present in each layer. As a result, since it is difficult to move electric charges through the mid-level and the like, electron blocking efficiency may be increased. However, if the layers constituting the electron blocking layer 3 are made of the same material, there may be cases where the mid-levels present in the layers may be completely the same as each other, and therefore, it is preferable that the materials of the layers are different from each other in order to further increase electron blocking efficiency.

Further, a bias voltage may be applied so as to collect electrons in the electrode 2 and holes in the electrode 5. In this case, the arrangement of the electron blocking layer 3 may be replaced with the photoelectric conversion layer 4.

Further, the electrons or the holes collected in the electrode 5 may be converted into the voltage signal according to the quantity thereof to be extracted to the outside.

Next, a method of manufacturing the organic photoelectric conversion device 10 will be described.

First, an ITO film is formed on the substrate 1 by, for example, a sputtering method to form the electrode 2. Next, the film of the electron blocking material is formed on the electrode 2 by, for example, a deposition to form the electron blocking layer 3.

Next, the p-type organic semiconductor and the fullerene or the fullerene derivative are, for example, deposited on the electron blocking layer 3 to form the photoelectric conversion layer 4. Then, for example, ITO is formed on the photoelectric conversion layer 4 by a sputtering method to form the electrode 5. Subsequently, the film of silicon oxide is formed on the electrode 5 and the substrate 1 by, for example, a deposition to form the passivation layer 6.

Next, a constitution example of an imaging device using the organic photoelectric conversion device 10 will be described.

[Photosensor]

The photoelectric conversion device may be largely divided into a photocell and an photosensor, but the photoelectric conversion device of the present invention is suitable for the photosensor. As a photosensor, the photoelectric conversion device may be used alone, or may be a form of a line sensor disposed in a linear shape or a form of a two-dimensional sensor disposed on a plane. The photoelectric conversion device of the present invention serves as an imaging device in such a manner that, when used in the form of a line sensor, optical image information are converted into an electric signal by using an optical system and a driving part such as a scanner, and the like, and when used in the form of a two-dimensional sensor, optical image information is formed on a sensor using an optical system like an imaging module, to be converted into an electric signal.

As the photocell is a power generation apparatus, the efficiency of converting light energy into electric energy is considered to be an important performance, but a dark current that is a current in a dark room is not considered as a problem in view of a function thereof. Further, a heating process in a subsequent step such as installation of a color filter is not required. As the conversion of a brightness signal into an electric signal with a high precision is an important performance for the photosensor, the efficiency of converting a light quantity into current is also an important performance, but if the signal is output in a dark room, the signal becomes a noise, and thus, a low dark current is required. In addition, resistance to the process of the subsequent step is also important.

[Imaging Device]

Next, a constitution example of an imaging device having the photoelectric conversion device will be described. Further, in the constitution examples described below, members having the same constitution or function as the members described above are designated by the same or equivalent reference numerals in the drawings, and the descriptions thereof will be simplified or omitted.

The imaging device is a device that converts optical information of an image into an electric signal, in which a plurality of photoelectric conversion devices are disposed on a matrix in the same planar form, and each of the photoelectric conversion devices (pixel) may convert light signals into electric signals, and output the electric signals sequentially to the outside of the imaging device. Accordingly, each single pixel is constituted by one photoelectric conversion device and one or more transistors.

FIG. 2 is a cross-sectional view schematically illustrating the constitution of an imaging device for describing an embodiment of the present invention. The imaging device is mounted and used in an imaging apparatus such as a digital camera, and a digital video camera, and an imaging module such as an electronic endoscope and a mobile phone.

This imaging device has a plurality of organic photoelectric conversion devices having the same constitution as shown in FIG. 1, and a circuit board on which a reading circuit is formed which reads signals according to the electric charges generated in the photoelectric conversion layer of each of the organic photoelectric conversion devices, and the plurality of organic photoelectric conversion devices is one-dimensionally or two-dimensionally arranged on the same surface of an upper side of the circuit board.

An imaging device 100 shown in FIG. 2 includes a substrate 101, a dielectric layer 102, a connection electrode 103, a pixel electrode 104, a connection portion 105, a connection portion 106, an organic layer 107, a counter electrode 108, a buffer layer 109, a passivation layer 110, a color filter (CF) 111, a partition wall 112, a light-shielding layer 113, a protection layer 114, a counter electrode voltage supply portion 115, and a reading circuit 116.

The pixel electrode 104 has the same function as the electrode 2 of the organic photoelectric conversion device 10 shown in FIG. 1. The counter electrode 108 has the same function as the electrode 5 of the organic photoelectric conversion device 10 shown in FIG. 1. The organic layer 107 has the same constitution as the layer formed between the electrode 2 and the electrode 5 of the organic photoelectric conversion device 10 shown in FIG. 1. The passivation layer 110 has the same function as the passivation layer 6 of the organic photoelectric conversion device 10 shown in FIG. 1. The pixel electrode 104, a portion of the counter electrode 108 facing the pixel electrode 104, the organic layer 107 interposed between the electrodes, the buffer layer 109 facing the pixel electrode 104, and a portion of the passivation layer 110 constitute the organic photoelectric conversion device.

The substrate 101 is a glass substrate or a semiconductor substrate such as Si. The dielectric layer 102 is formed on the substrate 101. A plurality of pixel electrodes 104 and a plurality of connection electrodes 105 are formed on the surface of the dielectric layer 102.

The organic layer 107, which is provided to cover the plurality of pixel electrodes 104, is a single layer common to all of the organic photoelectric conversion devices.

The counter electrode 108 provided on the organic layer 107 is a single electrode common to all of the organic photoelectric conversion devices. The counter electrode 108 is formed up to the connection electrode 103 disposed at the outer side of the organic layer 107, and electrically connected to the connection electrode 103.

The connection portion 106 is a plug which is buried in the dielectric layer 102 to electrically connect the connection electrode 103 and the counter electrode voltage supply portion 115, and the like. The counter electrode voltage supply portion 115 is formed on the substrate 101, and applies a predetermined voltage to the counter electrode 108 through the connection portion 106 and connection electrode 103. In the case where the voltage to be applied to the counter electrode 108 is higher than a power voltage of the imaging device, a predetermined voltage is supplied by increasing a power voltage by a voltage increasing circuit such as a charge pump.

The reading circuit 116 is installed on the substrate 101 to correspond to each of a plurality of pixel electrodes 104, and reads the signals according to the electric charges collected in the corresponding pixel electrode 104. The reading circuit 116 is constituted by, for example, a CCD, an MOS circuit or a TFT circuit, and is light-shielded by a light-shielding layer (not shown) disposed in the dielectric layer 102. The reading circuit 116 is electrically connected to the corresponding pixel electrode 104 through the connection portion 105.

The buffer layer 109 is formed on the counter electrode 108 to cover the counter electrode 108. The passivation layer 110 is formed on the buffer layer 109 to cover the buffer layer 109. The color filter 111 is formed at a position facing each of the pixel electrodes 104 on the passivation layer 110. The partition wall 112 is installed between the color filters 111 to improve light transmittance efficiency of the color filters 111.

The light-shielding layer 113 is formed in a region other than a region where the color filter 111 and the partition wall 112 are installed on the passivation layer 110, and prevents light from being incident on the organic layer 107 formed in a region other than an effective pixel region. The protection layer 114 is formed on the color filter 111, the partition wall 112 and the light-shielding layer 113, and protects the entire imaging device 100.

In the imaging device 100 thus constituted, when light is incident, light is incident on the organic layer 107, and electric charges are generated herein. The holes of the generated electric charges are collected in the pixel electrode 104, and the voltage signal according to the quantity thereof is output to the outside of the imaging device 100 by the reading circuit 116.

A method of manufacturing the imaging device 100 is as follows.

The connection portions 105 and 106, a plurality of connection electrodes 103, a plurality of pixel electrodes 104 and the dielectric layer 102 are formed on the circuit board on which the counter electrode voltage supply portion 115 and the reading circuit 116 are formed. The plurality of pixel electrodes 104 are arranged on the surface of the dielectric layer 102, for example, in a square lattice form.

Next, the organic layer 107 is formed on a plurality of pixel electrodes 104 by, for example, a vacuum thermal evaporation method. Then, the counter electrode 108 is formed on the organic layer 107 by, for example, a sputtering method in a vacuum. Subsequently, the buffer layer 109 and the passivation layer 110 are sequentially formed on the counter electrode 108 by, for example, a vacuum thermal evaporation method. Next, after the color filter 111, the partition wall 112 and the light-shielding layer 113 are formed, the protection layer 114 is formed, thereby completing the imaging device 100.

Hereinafter, constituent elements (the electron blocking layer 3, the photoelectric conversion layer 4, the electrode 2, the electrode 5 and the passivation layer 6) of the organic photoelectric conversion device will be described in detail.

[Photoelectric Conversion Layer]

The photoelectric conversion layer 4 is a layer that includes an organic photoelectric conversion material that receives light to generate electric charges according to a quantity of light thereof. It is preferable to use a material having sensitivity to a visible ray as the material of the photoelectric conversion layer 4.

The effect of the present invention may be accomplished by a constitution that the photoelectric conversion layer is a bulk hetero layer of a fullerene and the p-type organic semiconductor material, and the ionization potential of the photoelectric conversion layer is from 5.2 eV to 5.6 eV and is lower than the ionization potential of the electric charge blocking layer adjacent to the photoelectric conversion layer. If the ionization potential is 5.2 eV or more, generation of the dark current in the photoelectric conversion layer may be suppressed, and if the ionization potential is 5.6 eV or less, photoelectric conversion efficiency and light resistance of the photoelectric conversion device may be increased. The ionization potential of the photoelectric conversion layer is more preferably from 5.4 eV to 5.6 eV.

The ionization potential (Ip) of the photoelectric conversion layer of the present invention is measured by forming a film of the organic material in a thickness of about 100 nm on the quartz substrate and using AC-2 surface analysis equipment manufactured by Rikenkeiki Co., Ltd. in a light quantity of 5 nW to 100 nW.

The p-type organic semiconductor material (compound) constituting the photoelectric conversion layer 4 is a donor-type organic semiconductor (compound), mainly represented by a hole transporting organic compound, and an organic compound having a property of easily donating electrons. More specifically, the p-type organic semiconductor material is an organic compound having a lower ionization potential when two organic materials are used in contact with each other. Accordingly, the donor-type organic compound may be any organic compound as long as the organic compound is an electron-donating organic compound. For example, a metal complex having a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, merocyanine compound, an oxonol compound, a polyamine compound, an indole compound, a pyrrole compound, a pyrazole compound, a polyarylene compound, a condensed aromatic carbon ring compound (a naphthalene derivative, an anthracene derivative, a phenanthrene derivative, a tetracene derivative, a pyrene derivative, a perylene derivative, and a fluoranthene derivative), or a heterocyclic compound containing nitrogen as a ligand and like may be used. Further, the examples are not limited thereto, and any organic compound may be used as a donor-type organic semiconductor as long as the organic compound is an organic compound having the ionization potential that is lower than that of the organic compound used as the n-type organic semiconductor.

Any organic dye may be used as the p-type organic semiconductor material, but preferably, may include a cyanine dye, a styryl dye, a hemicyanine dye, a merocyanine dye (including zeromethine merocyanine (simple merocyanine)), a trinuclear merocyanine dye, a tetranuclear merocyanine dye, a laudacyanine dye, a complex cyanine dye, a complex merocyanine dye, an allophore dye, an oxonol dye, a hemioxonol dye, a squarylium dye, a croconium dye, an azamethine dye, a coumarin dye, an arylidene dye, an anthraquinone dye, a triphenylmethane dye, an azo dye, an azomethine dye, a Spiro compound, a metallocene dye, a fluorenone dye, a fulgide dye, a perylene dye, a perinone dye, a phenazine dye, a phenothiazine dye, a quinone dye, a diphenylmethane dye, a polyene dye, an acridine dye, an acrydinone dye, a diphenylamine dye, a quinacrydone dye, a quinaphthalone dye, a phenoxazine dye, a phthaloperylene dye, a diketopyrrolopyrrole dye, a dioxane dye, a porphyrine dye, a chlorophyll dye, a phthalocyanine dye, a metal complex dye, and a condensed aromatic carbon ring-based dye (a naphthalene derivative, an anthracene derivative, a phenanthrene derivative, a tetracene derivative, a pyrene derivative, a perylene derivative, and a fluoranthene derivative).

[Fullerene or Fullerene Derivative]

The photoelectric conversion layer 4 includes a fullerene or a fullerene derivative. A fullerene represents fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene and fullerene nanotubes, and a fullerene derivative represents to a compound where a substituent is added thereto.

The substituent of the fullerene derivative is preferably an alkyl group, an aryl group or a heterocyclic group. The alkyl group is more preferably an alkyl group having 1 to 12 carbon atoms, and the aryl group and the heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indol ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring, more preferably a benzene ring, a naphthalene ring, an anthracene ring, a phenanthrene ring, a pyridine ring, an imidazole ring, an oxazole ring or a thiazole ring, and particularly preferably a benzene ring, a naphthalene ring or a pyridine ring. These may further have a substituent, and the substituent may be bonded to each other to form a ring, to a maximum extent. Further, it may have a plurality of substituents, and the substituents may be the same as or different from each other. Further, the plurality of substituents may be bonded to each other to form a ring, to a maximum extent.

The photoelectric conversion layer 4 includes fullerene or the fullerene derivative, thereby it becomes possible to rapidly transport the electric charges generated by photoelectric conversion via the fullerene molecules or the fullerene derivative molecules to the electrode 2 or the electrode 5. If the fullerene molecules or the fullerene derivative molecules are connected to form a path of electrons, an electron transporting property is improved, thus it becomes possible to implement a high-speed response of the organic photoelectric conversion device. To this end, it is preferable that fullerene or the fullerene derivative is included in the photoelectric conversion layer 4 in a volume ratio of 40% or more. However, if the fullerene or the fullerene derivative is included in an excessive amount, the amount of the p-type organic semiconductor is reduced, and a junction interface is reduced, thereby decreasing an exciton dissociation efficiency.

In the photoelectric conversion layer 4, it is particularly preferred to use a triarylamine compound as the p-type organic semiconductor to be mixed with the fullerene or the fullerene derivative as described in Japanese Patent No. 4213832 and the like, because it is possible to achieve a high SN ratio of the organic photoelectric conversion device. If the ratio of fullerene or the fullerene derivative in the photoelectric conversion layer 4 is excessively high, the triarylamine compound becomes less, such that an absorption quantity of incident light is reduced. As a result, the photoelectric conversion efficiency is reduced, and accordingly, it is preferred that the fullerene or the fullerene derivative included in the photoelectric conversion layer 4 is a composition of 85% by volume or less.

It is preferred that the p-type organic semiconductor material is a compound represented by the following Formula (1).

[Chem. 2]

Formula (1)

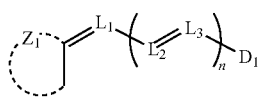

(wherein $Z_1$ is a ring including at least two carbon atoms and represents a 5-membered ring, a 6-membered ring, or a condensed ring containing at least one of the 5-membered ring and the 6-membered ring. Each of $L_1$, $L_2$ and $L_3$ independently represents an unsubstituted methine group or a substituted methine group. $D_1$ represents an atom group. n represents an integer of 0 or more.)

$Z_1$ is a ring including at least two carbon atoms and represents a 5-membered ring, a 6-membered ring, or a condensed ring containing at least one of the 5-membered ring and the 6-membered ring. It is preferred that, as the 5-membered ring, the 6-membered ring, or the condensed ring containing at least one of the 5-membered ring and the 6-membered ring, those which are generally used as an acidic nucleus in a merocyanine dye are preferable, and specific examples thereof include the followings.

(a) 1,3-dicarbonyl nucleus: for example, 1,3-indandione nucleus, 1,3-cyclohexanedione, 5,5-dimethyl-1,3-cyclohexanedione, 1,3-dioxane-4,6-dione and the like.

(b) pyrazolinone nucleus: for example, 1-phenyl-2-pyrazoline-5-one, 3-methyl-1-phenyl-2-pyrazoline-5-one, 1-(2-benzothiazoyl)-3-methyl-2-pyrazoline-5-one and the like.

(c) isoxazolinone nucleus: for example, 3-phenyl-2-isoxazoline-5-one, 3-methyl-2-isoxazoline-5-one and the like.

(d) oxyindole nucleus: for example, 1-alkyl-2,3-dihydro-2-oxyindole and the like.

(e) 2,4,6-triketohexahydropyrimidine nucleus: for example, barbituric acid or 2-thiobarbituric acid and derivatives thereof. Examples of the derivatives may include a 1-alkyl derivative such as 1-methyl and 1-ethyl, a 1,3-dialkyl derivative such as 1,3-dimethyl, 1,3-diethyl, and 1,3-dibutyl, a 1,3-diaryl derivative such as 1,3-diphenyl, 1,3-di(p-chlorophenyl), and 1,3-di(p-ethoxycarbonylphenyl), a 1-alkyl-1-aryl derivative such as 1-ethyl-3-phenyl, a 1,3-diheterocyclic-substituted derivative such as 1,3-di(2-pyridyl) and the like.

(f) 2-thio-2,4-thiazolidinedione nucleus: for example, laudanine, derivatives thereof and the like. Examples of the derivatives may include 3-alkyllaudanine such as 3-methyllaudanine, 3-ethyllaudanine, and 3-allyllaudanine, 3-aryllaudanine such as 3-phenyllaudanine, 3-heterocyclic-substituted laudanine such as 3-(2-pyridyl)laudanine and the like.

(g) 2-thio-2,4-oxazolidinedione (2-thio-2,4-(3H,5H)-oxazoledione) nucleus: for example, 3-ethyl-2-thio-2,4-oxazolidinedione and the like.

(h) thianaphthenone nucleus: for example, 3(2H)-thianaphthenone-1,1-dioxide and the like.

(i) 2-thio-2,5-thiazolidinedione nucleus: for example, 3-ethyl-2-thio-2,5-thiazolidinedione and the like.

(j) 2,4-thiazolidinedione nucleus: for example, 2,4-thiazolidinedione, 3-ethyl-2,4-thiazolidinedione, 3-phenyl-2,4-thiazolidinedione and the like.

(k) thiazoline-4-one nucleus: for example, 4-thiazolinone, 2-ethyl-4-thiazolinone and the like.

(l) 2,4-imidazolidinedione (hidantoin) nucleus: for example, 2,4-imidazolidinedione, 3-ethyl-2,4-imidazolidinedione and the like.

(m) 2-thio-2,4-imidazolidinedione (2-thiohidantoin) nucleus: for example, 2-thio-2,4-imidazolidinedione, 3-ethyl-2-thio-2,4-imidazolidinedione and the like.

(n) imidazoline-5-one nucleus: for example, 2-propylmercapto-2-imidazoline-5-one and the like.

(o) 3,5-pyrazolidinedione nucleus: for example, 1,2-diphenyl-3,5-pyrazolidinedione, 1,2-dimethyl-3,5-pyrazolidinedione and the like.

(p) benzothiophene-3-one nucleus: for example, benzothiophene-3-one, oxobenzothiophene-3-one, dioxobenzothiophene-3-one and the like.

(q) indanone nucleus: for example, 1-indanone, 3-phenyl-1-indanone, 3-methyl-1-indanone, 3,3-diphenyl-1-indanone, 3,3-dimethyl-1-indanone and the like.

The ring represented by $Z_1$ is preferably a 1,3-dicarbonyl nucleus, a pyrazolinone nucleus, a 2,4,6-triketohexahydropyrimidine nucleus (including a thioketone body, for example, a barbituric acid nucleus, and a 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazoline-5-one nucleus, a 3,5-pyrazolidinedione nucleus, a benzothiophene-3-one nucleus, and an indanone nucleus, and more preferably a 1,3-dicarbonyl nucleus, a 2,4,6-triketohexahydropyrimidine nucleus (including a thioketone body, for example, a barbituric acid nucleus, and a 2-thiobarbituric acid nucleus), a 3,5-pyrazolidinedione nucleus, a benzothiophene-3-one nucleus, and an indanone nucleus, and more preferably a 1,3-dicarbonyl nucleus, a 2,4,6-triketohexahydropyrimidine nucleus (including a thioketone body, for example, a barbituric acid nucleus, and a 2-thiobarbituric acid nucleus), and particularly preferably a 1,3-indandione nucleus, a barbituric acid nucleus, a 2-thiobarbituric acid nucleus and a derivative thereof.

Each of $L_1$, $L_2$ and $L_3$ independently represents an unsubstituted methine group or a substituted methine group. A ring (e.g. a 6-membered ring, for example, a benzene ring) may be formed by bonding the substituted methine groups. The substituent of the substituted methine group may be substituent W, and it is preferred that all of the $L_1$, $L_2$, and $L_3$ are the unsubstituted methine group.

$L_1$ to $L_3$ may be linked to each other to form a ring, and preferred examples of the formed ring may include a cyclohexene ring, a cyclopentene ring, a benzene ring, a thiophene ring and the like.

n represents an integer of 0 or more, preferably an integer of 0 to 3, and more preferably 0. In the case where n is increased, an absorption wavelength region may be a long wavelength, but a decomposition temperature by heat is decreased. It is preferred that n is 0 in that appropriate absorption is provided in a visible ray region and thermal decomposition is suppressed during film formation by deposition.

$D_1$ represents an atom group. It is preferred that $D_1$ is a group including —$NR^a(R^b)$, and it is more preferred that $D_1$ represents an arylene group in which —$NR^a(R^b)$ is substituted. Each of $R^a$ and $R^b$ independently represents a hydrogen atom or a substituent.

The arylene group represented by $D_1$ is preferably an arylene group having 6 to 30 carbon atoms, and more preferably an arylene group having 6 to 18 carbon atoms. The arylene group may have a substituent W as described below, and preferably an arylene group having 6 to 18 carbon atoms, which may have an alkyl group having 1 to 4 carbon atoms. Examples thereof may include a phenylene group, a naphthylene group, an anthracenylene group, a pyrenylene group, a phenanthrenylene group, a methylphenylene group, a dimethylphenylene group and the like, and a phenylene group or a naphthylene group is preferable.

The substituent represented by $R^a$ and $R^b$ may be substituent W as described below, and is preferably an aliphatic hydrocarbon group (preferably an alkyl group, or an alkenyl group, which may be substituted), an aryl group (preferably a phenyl group which may be substituted), or a heterocyclic group.

Each of the aryl group represented by $R^a$ and $R^b$ is independently preferably an aryl group having 6 to 30 carbon atoms and more preferably an aryl group having 6 to 18 carbon atoms. The aryl group may have a substituent, and is preferably an aryl group having 6 to 18 carbon atoms, which may have an alkyl group having 1 to 4 carbon atoms or an aryl group having 6 to 18 carbon atoms. Examples thereof may include a phenyl group, a naphthyl group, an anthracenyl group, a pyrenyl group, a phenanthrenyl group, a methylphenyl group, a dimethylphenyl group, a biphenyl group and the like, and a phenyl group or a naphthyl group is preferred.

Each of the heterocyclic groups represented by $R^a$ and $R^b$ is independently preferably a heterocyclic group having 3 to 30 carbon atoms and more preferably a heterocyclic group having 3 to 18 carbon atoms. The heterocyclic group may have a substituent, and is preferably a heterocyclic group having 3 to 18 carbon atoms, which may have an alkyl group having 1 to 4 carbon atoms or an aryl group having 6 to 18 carbon atoms. In addition, it is preferred that the heterocyclic group represented by $R^a$ and $R^b$ is a condensed ring structure, a condensed ring structure of combination of rings selected from a furane ring, a thiophene ring, a cellenophene ring, a sylol ring, a pyridine ring, pyrazine ring, a pyrimidine ring, an oxazole ring, a thiazole ring, a triazole ring, an oxadiazole ring, and a thiadiazole ring (the rings may be the same as each other), and a quinoline ring, an isoquinoline ring, a benzothiophene ring, a dibenzothiophene ring, a thienothiophene ring, a bithienobenzene ring, and a bithienothiophene ring.

The arylene group and the aryl group represented by $D_1$, $R^a$ and $R^b$ are preferably a benzene ring or a condensed ring structure, and more preferably a condensed ring structure including a benzene ring, and examples thereof may include a naphthalene ring, an anthracene ring, a pyrene ring, and a phenanthrene ring, and more preferably a benzene ring, a naphthalene ring or an anthracene ring, and even more preferably a benzene ring or a naphthalene ring.

Examples of substituent W may include a halogen atom, an alkyl group (including a cycloalkyl group, a bicycloalkyl group, and a tricycloalkyl group), an alkenyl group (including a cycloalkenyl group, and a bicycloalkenyl group), an alkynyl group, an aryl group, a heterocyclic group (may also be called a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anylino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an imide group, a phosphino group, a phosphinyl group, a phosphinyloxy group, a phosphinylamino group, a phosphono group, a silyl group, a hydrazino group, a ureide group, a boronic acid group (—B(OH)$_2$), a phosphate group (—OPO(OH)$_2$), a sulfate group (—OSO$_3$H), and other known substituents.

The compound represented by Formula (1) is a compound disclosed in Japanese Patent Application Laid-Open No. 2000-297068, and a compound that is not disclosed in JP 2000-297068 may be manufactured based on a synthesis method disclosed in JP 2000-297068.

It is preferable that the compound represented by Formula (1) be a compound represented by Formula (2).

[Chem. 3]

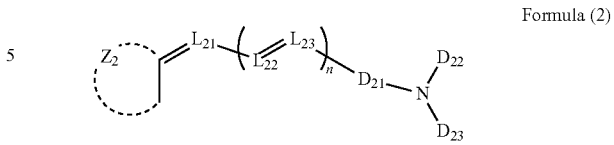

Formula (2)

(wherein $Z_2$, $L_{21}$, $L_{22}$, $L_{23}$ and n have the same meaning as $Z_1$, $L_1$, $L_2$, $L_3$ and n of Formula (1), and preferred examples thereof are the same. $D_{21}$ represents a substituted or unsubstituted arylene group. Each of $D_{22}$ and $D_{23}$ independently represents a substituted or unsubstituted aryl group or a substituted or unsubstituted heterocyclic group.)

The arylene group represented by $D_{21}$ has the same meaning as the arylene ring group represented by $D_1$, and preferred examples thereof are the same.

Each of the aryl group represented by $D_{22}$ and $D_{23}$ independently has the same meaning as the heterocyclic group represented by $R^a$ and $R^b$, and preferred examples thereof are the same.

$D_{21}$ and $D_{22}$, and $D_{21}$ and $D_{23}$ may respectively have a condensed ring structure.

Hereinafter, preferred specific examples of the compound represented by Formula (1) are represented by using Formula (3), but the present invention is not limited thereto.

Hereinafter, specific examples of the p-type organic material are shown, but the present invention is not limited thereto.

[Chem. 4]

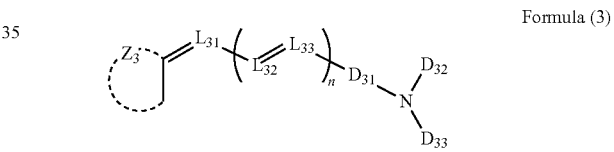

Formula (3)

In Formula (3), $Z_3$ represents any one of A-1 to A-12 in Table 1. $L_{31}$ represents methylene, and n represents 0. $D_{31}$ is any one of B-1 to B-9, and $D_{32}$ and $D_{33}$ represent any one of C-1 to C-18. A-1 or A-2 is preferable as $Z_3$, $D_{32}$ and $D_{33}$ are preferably selected from C-1, C-2, C-10, C-15, C-17 and C-18, and $D_{31}$ is preferably B-1. $D_{31}$ and $D_{32}$, and $D_{31}$ and $D_{33}$ may respectively have a condensed ring structure.

TABLE 1

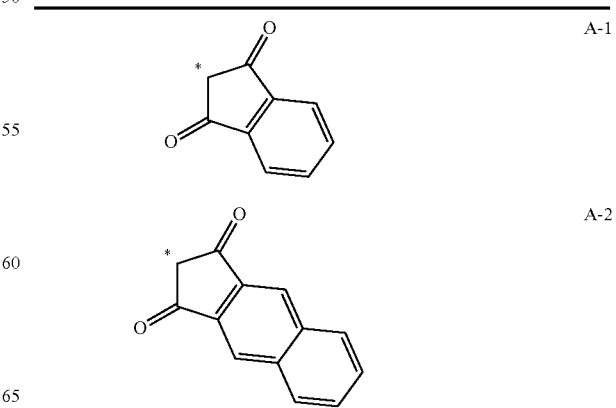

TABLE 1-continued
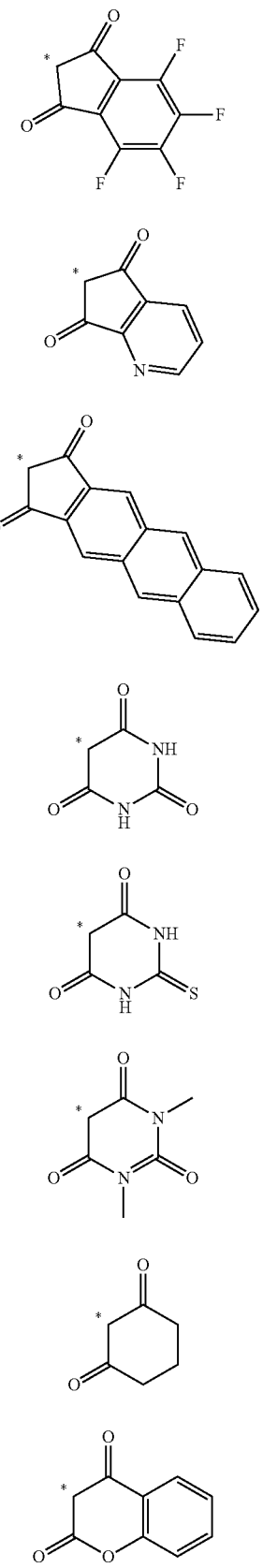
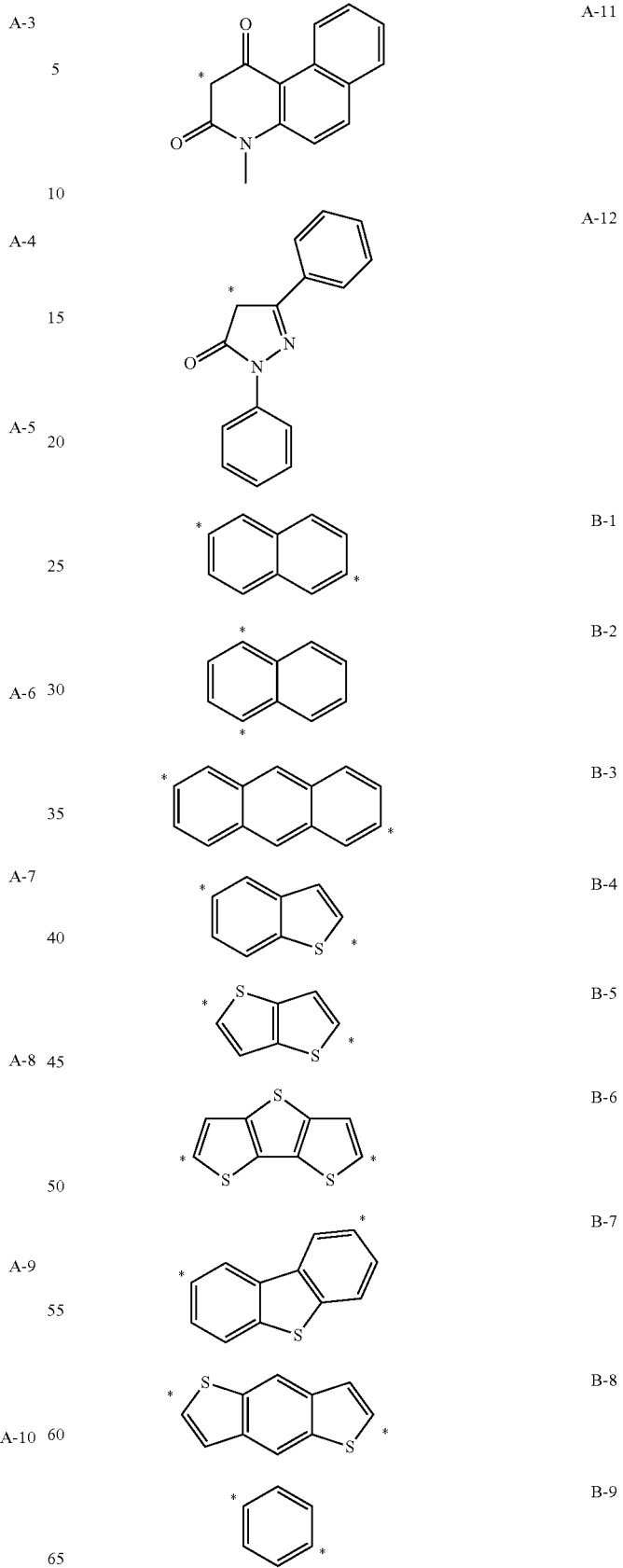

TABLE 1-continued

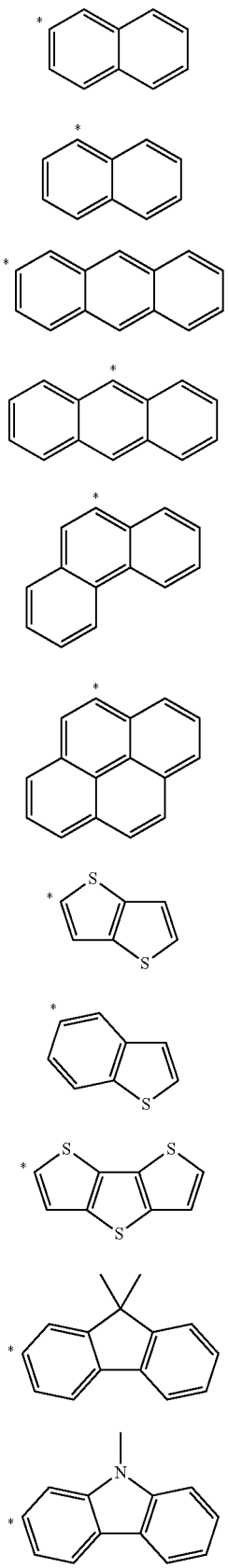

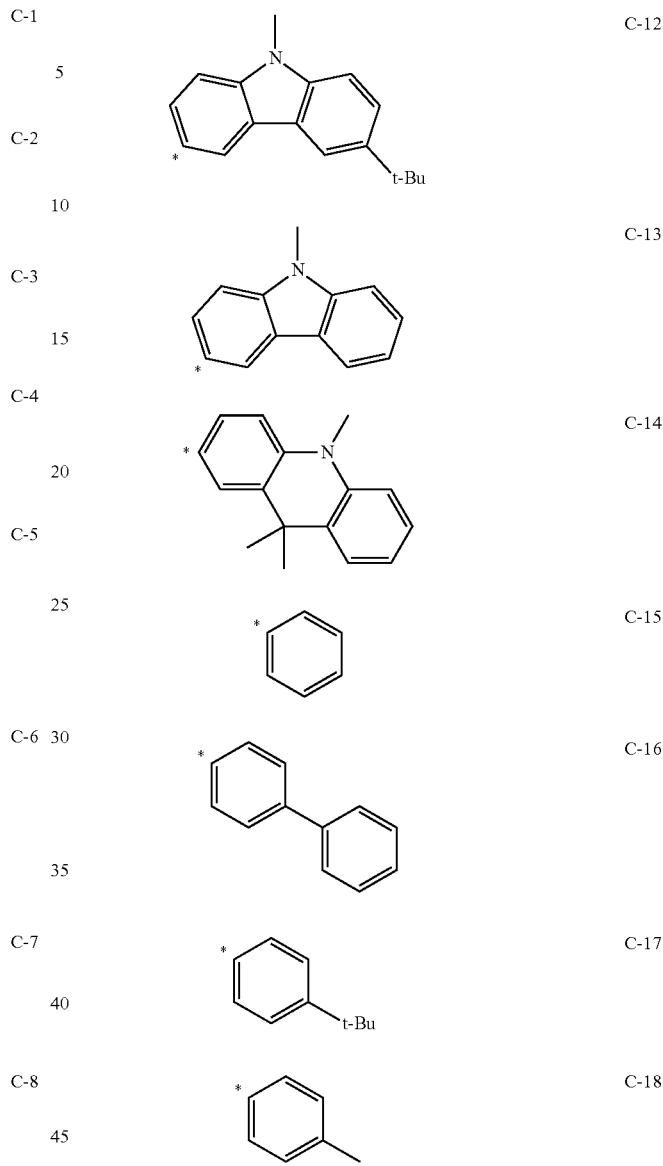

(* represents a bonding site in Table 1).

Examples of the particularly preferable p-type organic material may include a dye or a material not having five or more condensed ring structures (a material having 0 to 4 condensed ring structures and preferably 1 to 3 condensed ring structures). If a pigment-based p-type material generally used in an organic thin film solar cell is used, a dark current is apt to be easily increased at a pn interface, and a light response is easily delayed by a trap at crystal grain boundaries, such that it is difficult to use the pigment-based p-type material for an imaging device. Accordingly, a dye-based p-type material that is difficult to crystallize or a material not having five or more condensed ring structures may be preferably used for an imaging device.

More preferable specific examples of the compound represented by Formula (1) are combinations of the following substituent, connection group and partial structure in Formula (3), but the present invention is not limited thereto.

TABLE 2

| Compounds | Z₃ ring | $L_{31}$ | n | $D_{31}$ | $D_{32}$ | $D_{33}$ |
|---|---|---|---|---|---|---|
| 1 | A-1 | CH | 0 | B-9 | C-1 | C-1 |
| 2 | A-2 | CH | 0 | B-1 | C-1 | C-1 |
| 3 | A-3 | CH | 0 | B-9 | C-15 | C-15 |
| 4 | A-4 | CH | 0 | B-9 | C-15 | C-15 |
| 5 | A-5 | CH | 0 | B-9 | C-15 | C-15 |
| 6 | A-10 | CH | 0 | B-9 | C-15 | C-15 |
| 7 | A-11 | CH | 0 | B-9 | C-15 | C-15 |
| 8 | A-6 | CH | 0 | B-1 | C-15 | C-15 |
| 9 | A-7 | CH | 0 | B-1 | C-15 | C-15 |
| 10 | A-8 | CH | 0 | B-1 | C-15 | C-15 |
| 11 | A-9 | CH | 0 | B-1 | C-15 | C-15 |
| 12 | A-12 | CH | 0 | B-1 | C-15 | C-15 |
| 13 | A-2 | CH | 0 | B-2 | C-15 | C-15 |
| 14 | A-2 | CH | 0 | B-3 | C-15 | C-15 |
| 15 | A-2 | CH | 0 | B-9 | C-15 | C-15 |
| 16 | A-2 | CH | 0 | B-9 | C-16 | C-16 |
| 17 | A-1 | CH | 0 | B-9 | C-16 | C-16 |
| 18 | A-2 | CH | 0 | B-9 | C-1 | C-1 |
| 19 | A-2 | CH | 0 | B-1 | C-1 | C-2 |
| 20 | A-2 | CH | 0 | B-1 | C-1 | C-15 |
| 22 | A-2 | CH | 0 | B-1 | C-1 | C-3 |
| 23 | A-2 | CH | 0 | B-9 | C-15 | C-4 |
| 24 | A-2 | CH | 0 | B-9 | C-15 | C-5 |
| 25 | A-2 | CH | 0 | B-9 | C-15 | C-6 |
| 26 | A-2 | CH | 0 | B-9 | C-7 | C-7 |
| 27 | A-2 | CH | 0 | B-9 | C-8 | C-8 |
| 28 | A-2 | CH | 0 | B-1 | C-10 | C-10 |
| 29 | A-2 | CH | 0 | B-9 | C-11 | C-11 |
| 30 | A-2 | CH | 0 | B-9 | C-12 | C-12 |
| 31 | A-2 | CH | 0 | B-4 | C-15 | C-15 |
| 32 | A-2 | CH | 0 | B-5 | C-15 | C-15 |
| 33 | A-2 | CH | 0 | B-6 | C-15 | C-15 |
| 34 | A-2 | CH | 0 | B-7 | C-15 | C-15 |
| 35 | A-2 | CH | 0 | B-8 | C-15 | C-15 |
| 36 | A-2 | CH | 0 | B-1 | C-15 | C-15 |
| 37 | A-2 | CH | 0 | B-1 | C-17 | C-15 |
| 38 | A-2 | CH | 0 | B-1 | C-18 | C-15 |

Further, A-1 to A-12, B-1 to B-9 and C-1 to C-16 in Table 2 have the same meaning as those shown in Table 1.

Hereinafter, particularly preferable specific examples of the compound represented by Formula (1) are shown, but the present invention is not limited thereto.

[Chem. 5]

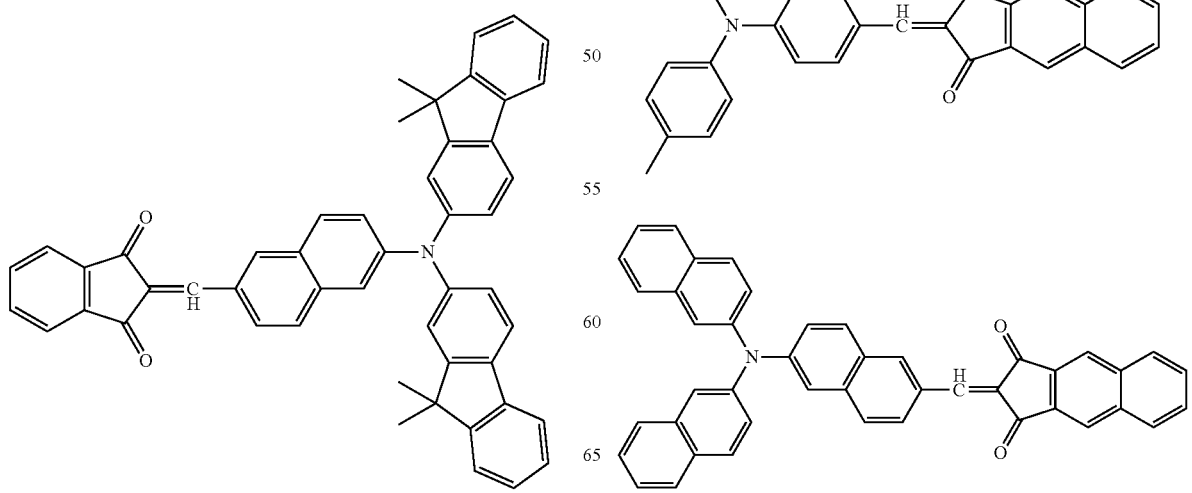

-continued

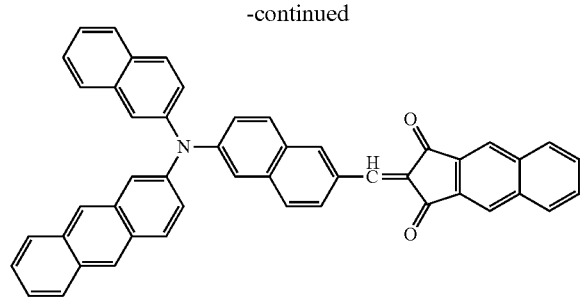

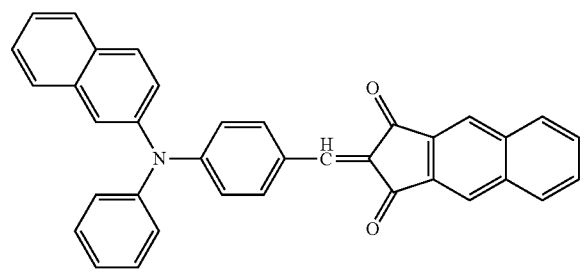

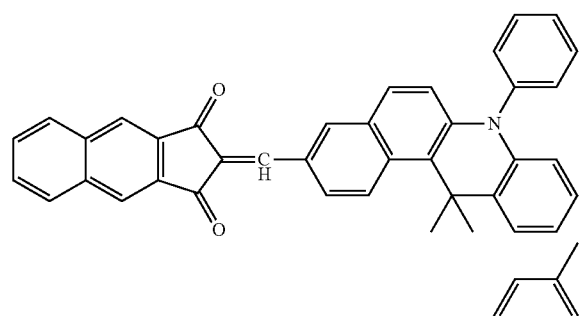

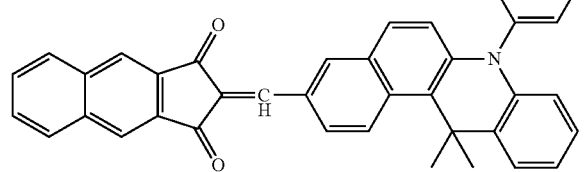

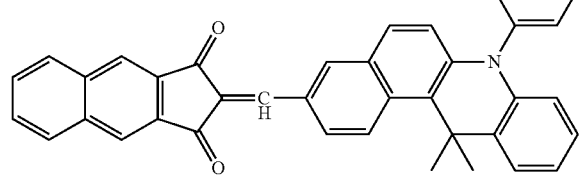

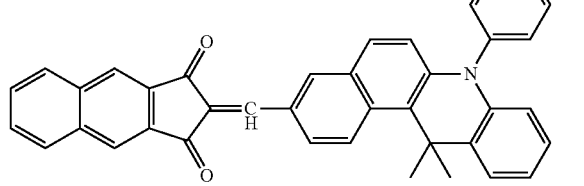

(Molecular Weight)

The molecular weight of the compound represented by Formula (1) is preferably 300 to 1,500, more preferably 350 to 1,200, and even more preferably 400 to 900, from the viewpoint of suitability for film formation. In the case where the molecular weight is excessively small, the film thickness of the formed photoelectric conversion layer is decreased by volatilization, and on the contrary, in the case where the molecular weight is excessively large, it is impossible to perform deposition, and thus it is impossible to manufacture the photoelectric conversion device.

(Melting Point)

The melting point of the compound represented by Formula (1) is preferably 200° C. or more, more preferably 220° C. or more, and even more preferably 240° C. or more, from the viewpoint of stability of deposition. If the melting point is low, melting is performed before the deposition, such that it is impossible to stably form the film, and the amount of decomposed materials of the compound is increased. Therefore, performance of the photoelectric conversion is degraded.

(Absorption Spectrum)

The peak wavelength of the absorption spectrum of the compound represented by Formula (1) is preferably 450 nm to 700 nm, more preferably 480 nm to 700 nm, and even more preferably 510 nm to 680 nm from the viewpoint of wide absorption of light in a visible region.

(Molar Absorbance Coefficient of the Peak Wavelength)

It is better that the molar absorbance coefficient of the compound represented by Formula (1) is as high as possible, from the viewpoint of an effective use of light. The molar absorbance coefficient in the visible region of the absorption spectrum (chloroform solution) having a wavelength of 400 nm to 700 nm is preferably 20000 $M^{-1}$ $cm^{-1}$ or more, more preferably 30000 $cm^{-1}$ or more, and even more preferably 40000 $M^{-1}$ $cm^{-1}$ or more.

[Electric Charge Blocking Layer: Electron Blocking Layer, Hole Blocking Layer]

[Electron Blocking Layer]

An electron donating organic material may be used in the electron blocking layer 3. Specifically, an aromatic diamine compound such as N,N-bis(3-methylphenyl)-1,1'-biphenyl)-4,4'-diamine (TPD) or 4,4'-bis[N-(naphthyl)-N-phenyl-amino]biphenyl (α-NPD), oxazole, oxadiazole, triazole, imidazole, imidazolone, a stilbene derivative, a pyrazoline derivative, tetrahydroimidazole, polyarylalkane, butadiene, 4,4',4"-tris(N-(3-methylphenyl)N-phenylamino)triphenylamine(m-MTDATA), porphine, a porphyrin compound such as tetraphenylporphine copper, phthalocyanine, copper phthalocyanine, and titanium phthalocyanineoxide, a triazole derivative, an oxadiazole derivative, an imidazole derivative, a polyarylalkane derivative, a pyrazoline derivative, a pyrazolone derivative, a phenylenediamine derivative, an anileamine derivative, an amino substituted calcone derivative, an oxazole derivative, a styrylanthracene derivative, a fluorenone derivative, a hydrazone derivative, and a silazane derivative may be used as a low molecular material, and a polymer such as phenylenevinylene, fluorene, carbazole, indole, pyrene, pyrrole, picoline, thiophene, acetylene, and diacetylene or a derivative thereof may be used as a polymer material. Any compound having a sufficient hole transporting property may be used even though the compound is not an electron donating compound.

It is preferred to use compounds represented by the following Formula (1-A1) or Formula (1-A2) as a material used in the electron blocking layer 3.

[Chem. 6]

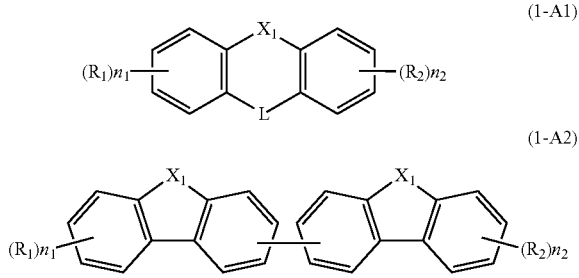

In Formula (1-A1) and Formula (1-A2), each of $R_1$ and $R_2$ independently represents a heterocyclic group that may be substituted by an alkyl group. Each of $X_1$ independently represents a carbon atom, a nitrogen atom, an oxygen atom, a sulfur atom, and a silicon atom, and may further have a substituent. L may represents a single bond, an oxygen atom, a sulfur atom, an alkylene group, an alkenylene group, a cycloalkylene group, a cycloalkenylene group, an arylene group, a divalent heterocyclic group or an imino group, which may further have a substituent. Each of $n_1$ and $n_2$ independently represents an integer of 1 to 4.

The heterocyclic group represented by $R_1$ and $R_2$ may include a condensed ring formed of 2 to 5 single rings. Further, the number of carbon atoms is preferably 6 to 30, and more preferably 6 to 20.

In addition, the alkyl group that may be substituted on the heterocyclic group is preferably an alkyl group having 1 to 6 carbon atoms, and may be a straight- or branched-chained alkyl group, or a cyclic alkyl group (cycloalkyl group), and a ring (for example, a benzene ring) may be formed by bonding a plurality of alkyl groups, but preferably a branched-chained alkyl group. Specific examples of the alkyl group may include a methyl group, an ethyl group, an isopropyl group, a t-butyl group, and a neopentyl group, and a t-butyl group is preferable.

L represents a single bond, an oxygen atom, a sulfur atom, an alkylene group, an alkenylene group, a cycloalkylene group, a cycloalkenylene group, an arylene group, a divalent heterocyclic group or an imino group. L is preferably a single bond, an alkylene group having 1 to 12 carbon atoms, an alkenylene group having 2 to 12 carbon atoms (for example, —CH$_2$=CH$_2$—), an arylene group having 6 to 14 carbon atoms (for example, a 1,2-phenylene group, and a 2,3-naphthylene group), a heterocyclic group having 4 to 13 carbon atoms, an oxygen atom, a sulfur atom, and an imino group (for example, a phenylimino group, a methylimino group, and a t-butylimino group) having a hydrocarbon group having 1 to 12 carbon atoms (preferably an aryl group or alkyl group), more preferably a single bond, an alkylene group having 1 to 6 carbon atoms (for example, a methylene group, a 1,2-ethylene group, and a 1,1-dimethylmethylene group), an oxygen atom, a sulfur atom, and an imino group having 1 to 6 carbon atoms, and particularly preferably a single bond or an alkylene group having 1 to 6 carbon atoms.

In the case where L represents an alkylene group, an alkenylene group, a cycloalkylene group, a cycloalkenylene group, an arylene group, a divalent heterocyclic group or an imino group, these may further have a substituent. Examples of the further substituent may include an alkyl group, a halogen atom, an aryl group, and a heterocyclic ring.

Examples of the heterocyclic group that may be substituted by the alkyl group represented by $R_1$ and $R_2$ may include the following N1 to N15. N2, N4, N13, N14 and N15 are preferable.

[Chem. 7]

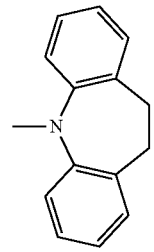
N1

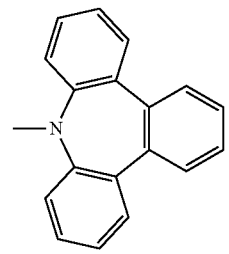
N2

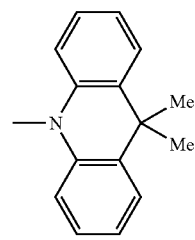
N3

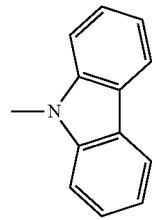
N4

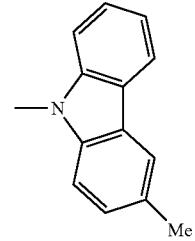
N5

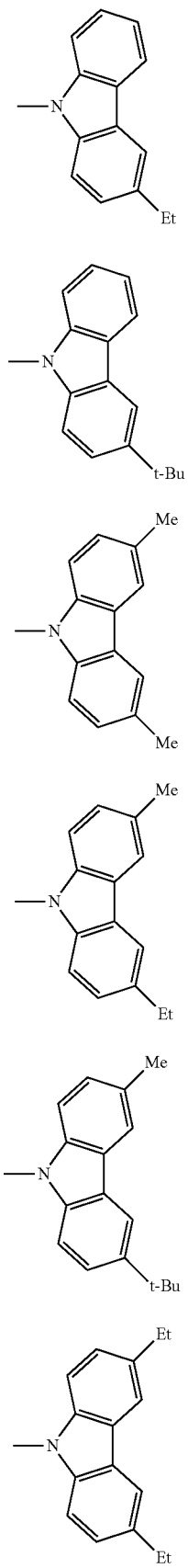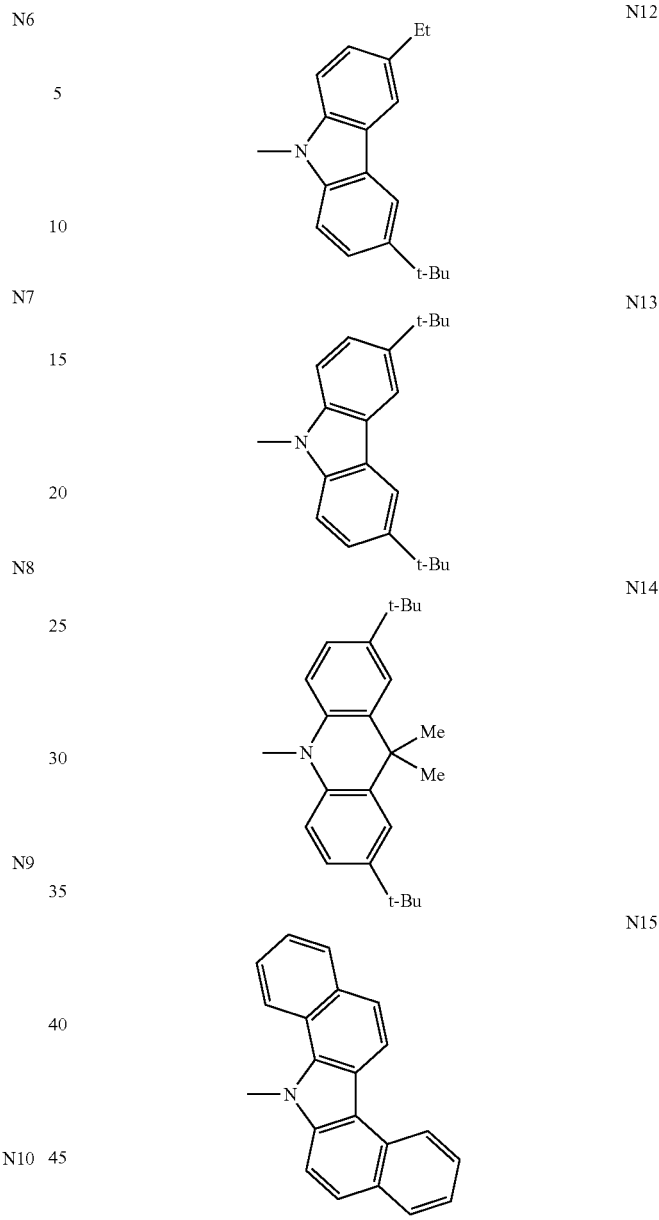

As the substituent which $X_1$ has, an alkyl group or an aryl group is preferable.

The alkyl group is preferably an alkyl group having 1 to 4 carbon atoms, examples thereof may include a methyl group, an ethyl group, a n-propyl group, an isopropyl group or a t-butyl group, and a methyl group is more preferable.

The aryl group is preferably an aryl group having 6 to 20 carbon atoms. The aryl group may have an alkyl group, and is preferably an aryl group having 6 to 15 carbon atoms, which may have an alkyl group having 1 to 4 carbon atoms. Examples thereof include a phenyl group, a naphthyl group, an anthracenyl group, a 9-dimethylfluorenyl group, a methylphenyl group, and a dimethylphenyl group, and preferably a phenyl group, a naphthyl group, an anthracenyl group and a 9-dimethylfluorenyl group.

Materials which are particularly preferable as the material of the electron blocking layer are represented by the following Formulas.

[Chem. 8]
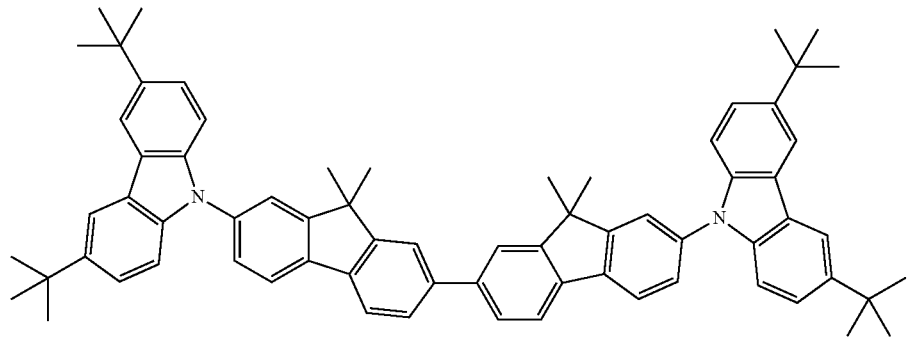
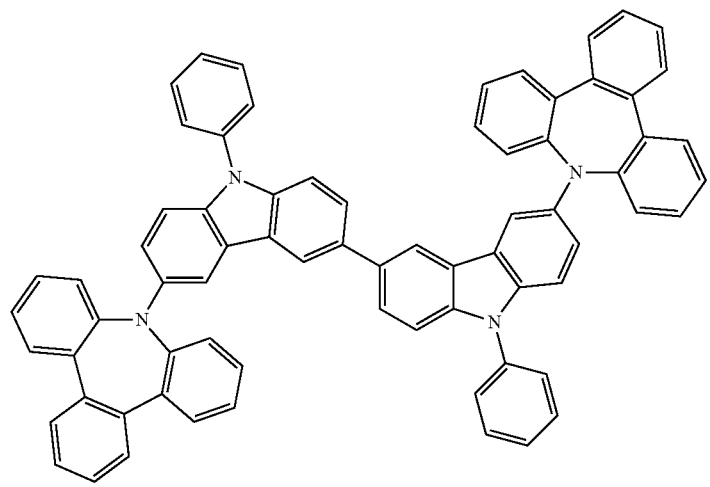
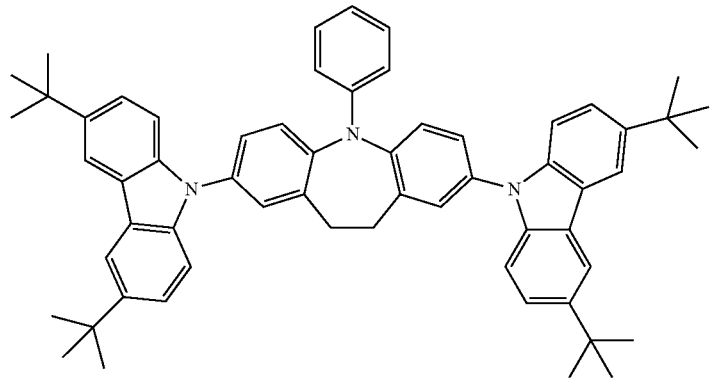
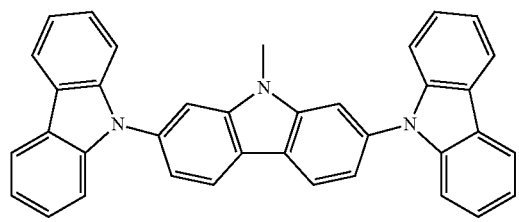

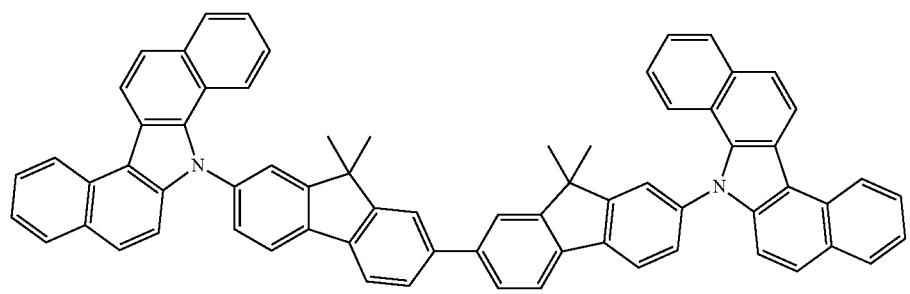
[Chem. 9]
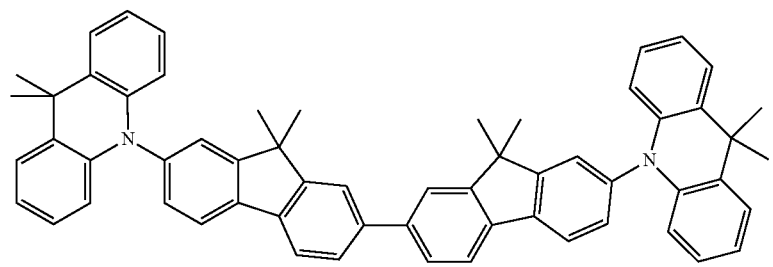
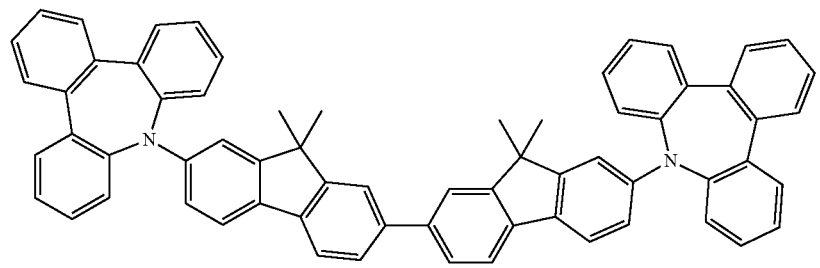
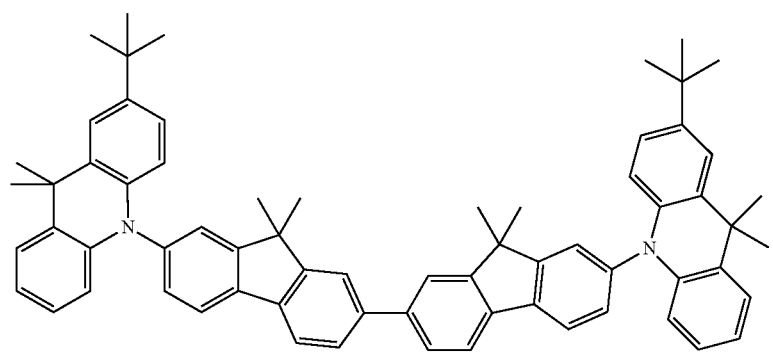
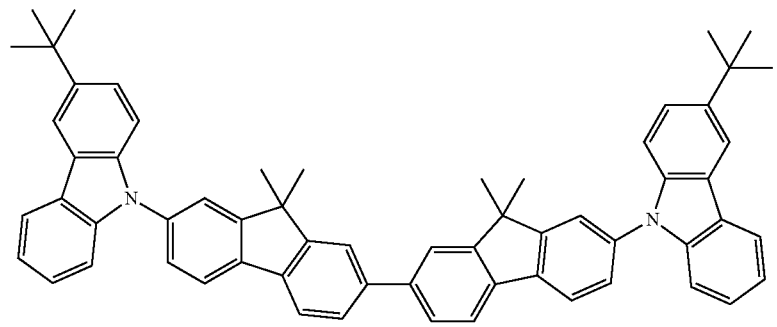

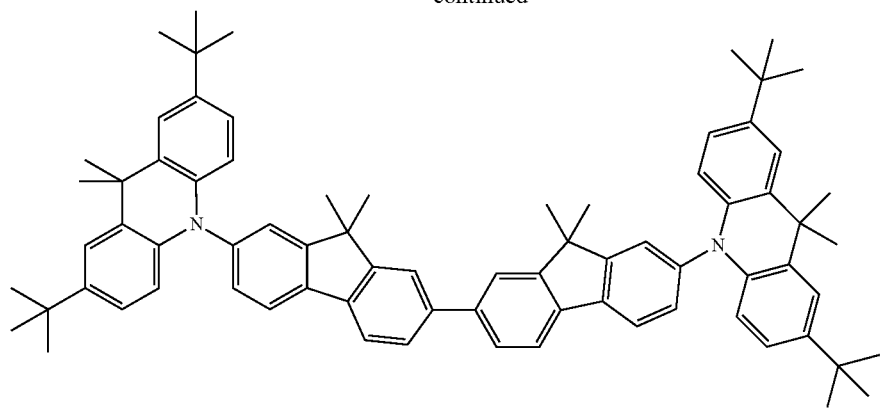
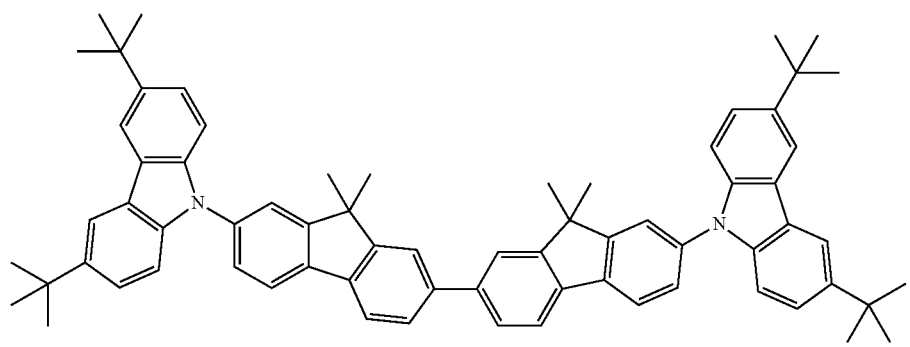
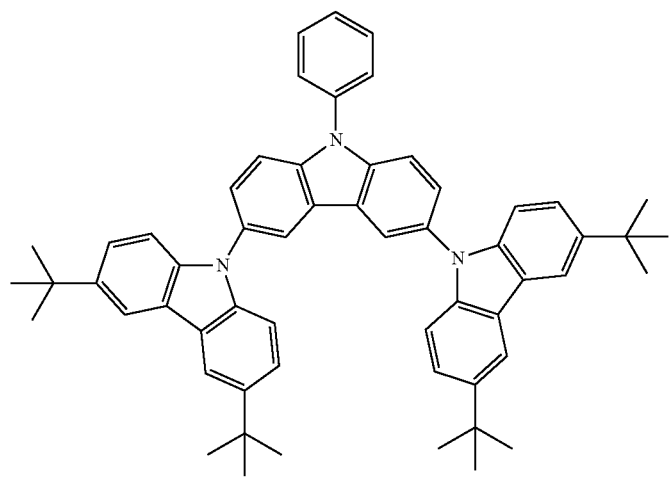

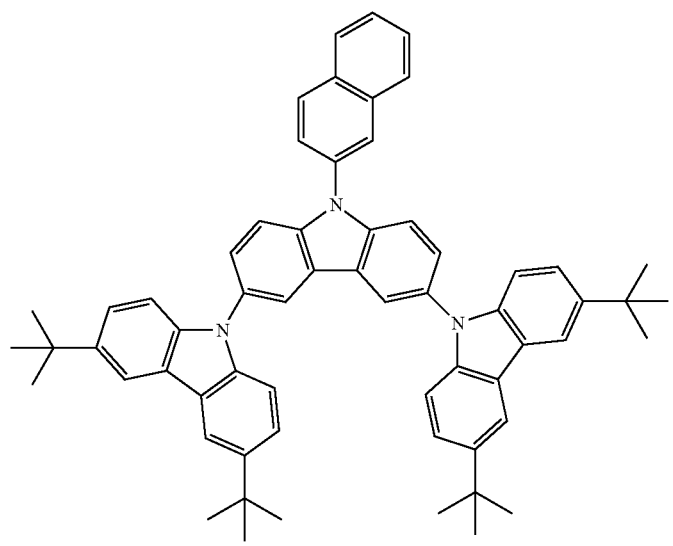
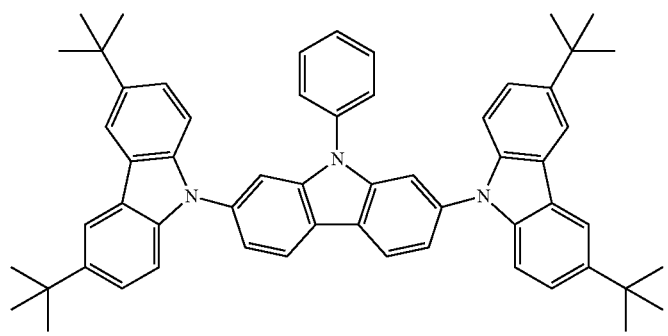
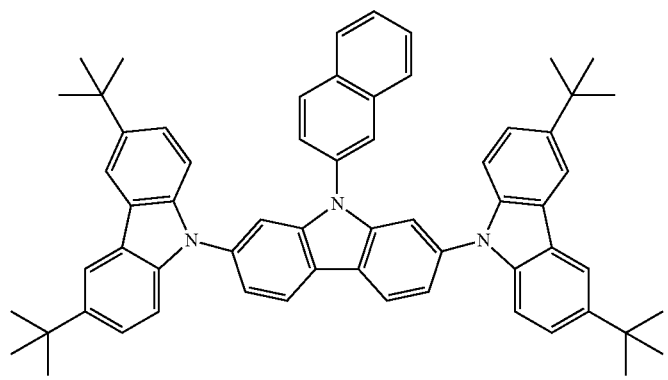
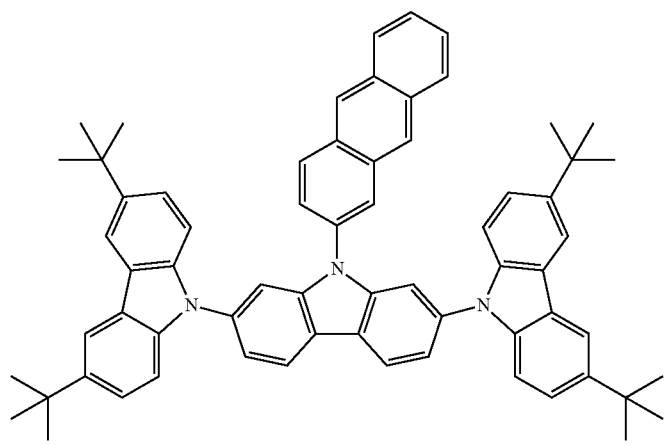

-continued
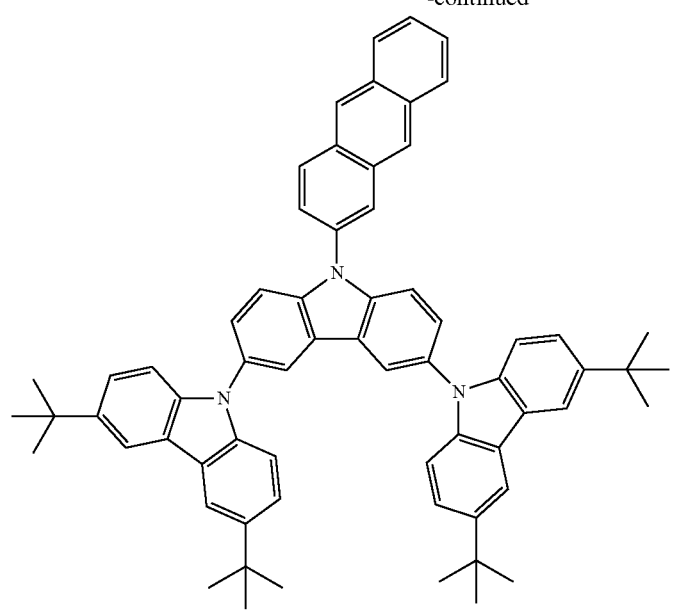
[Chem. 10]
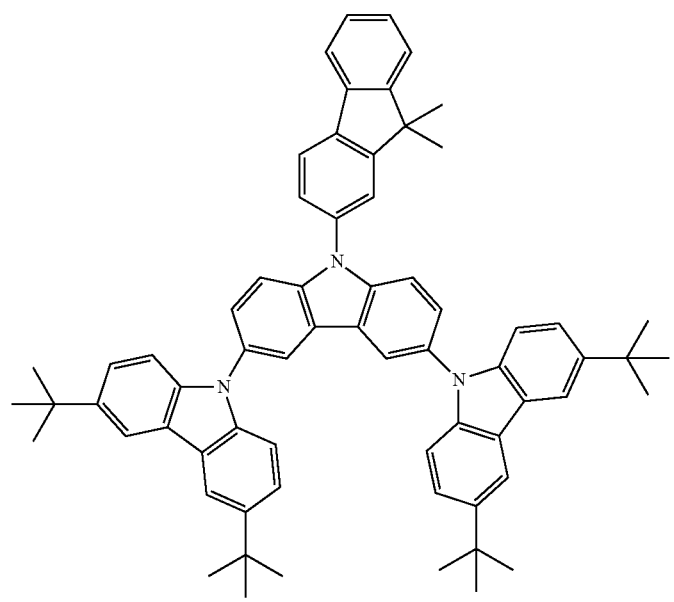
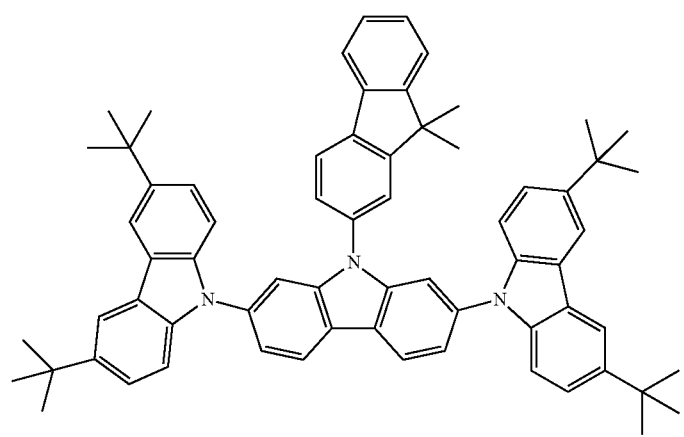

-continued
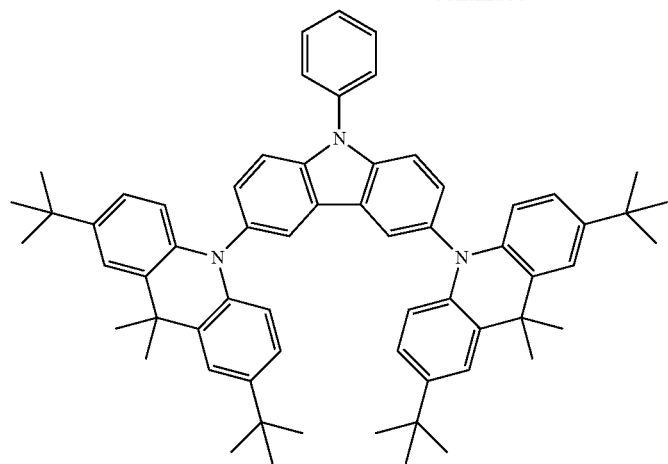
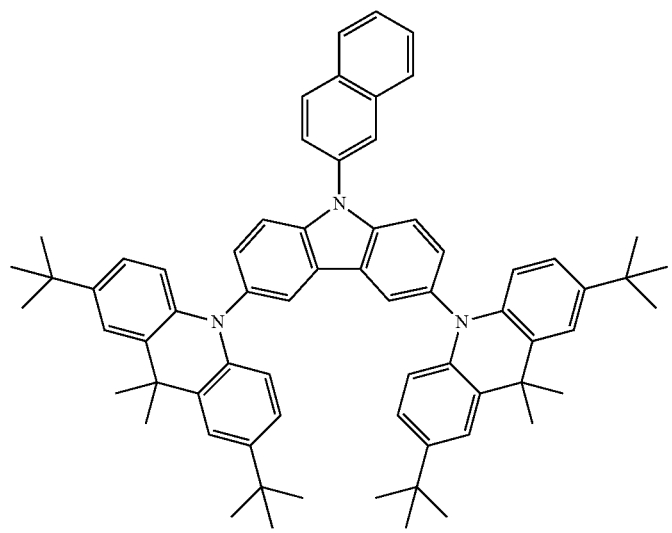
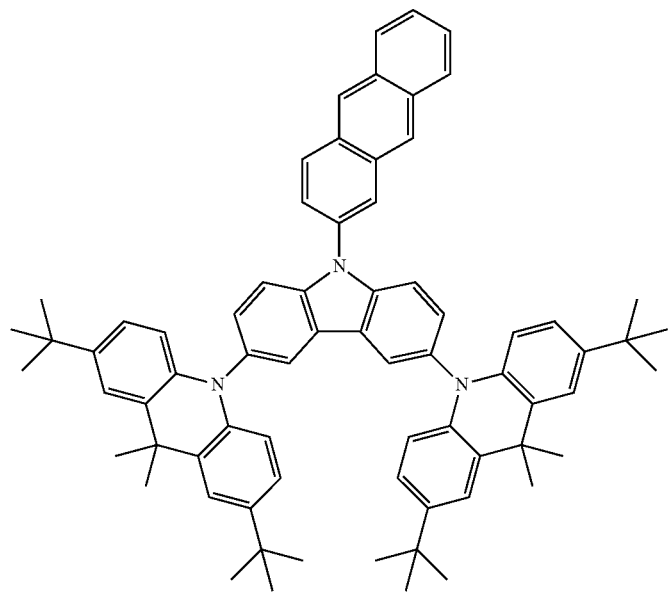

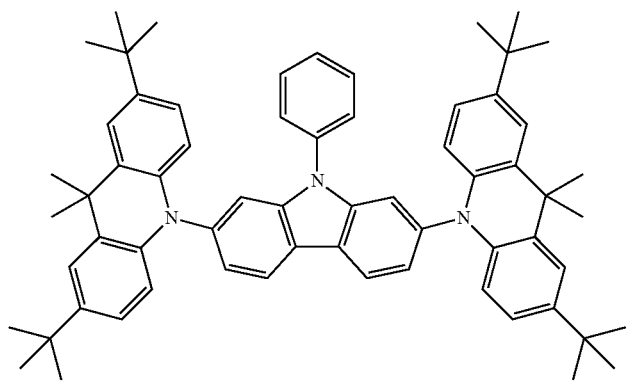
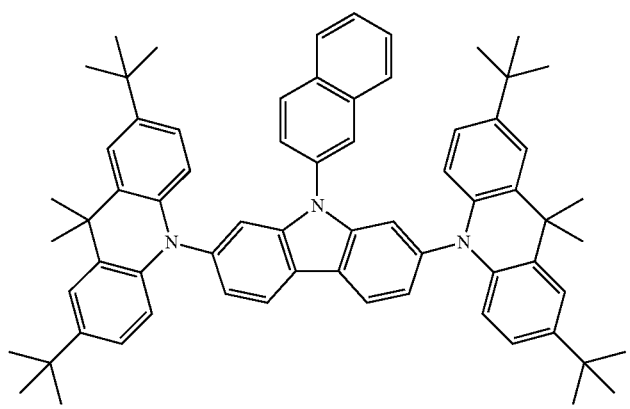
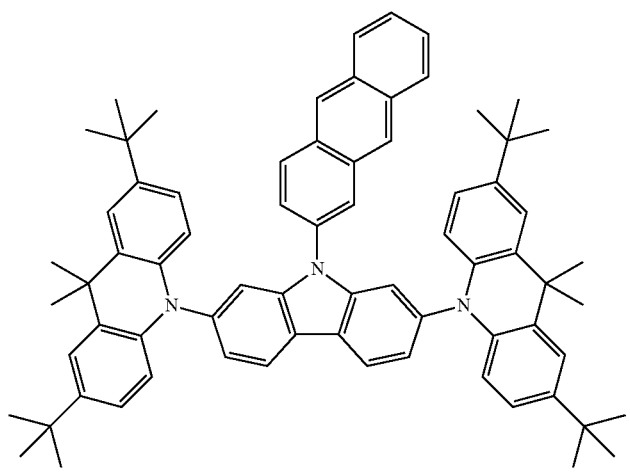

-continued
[Chem. 11]
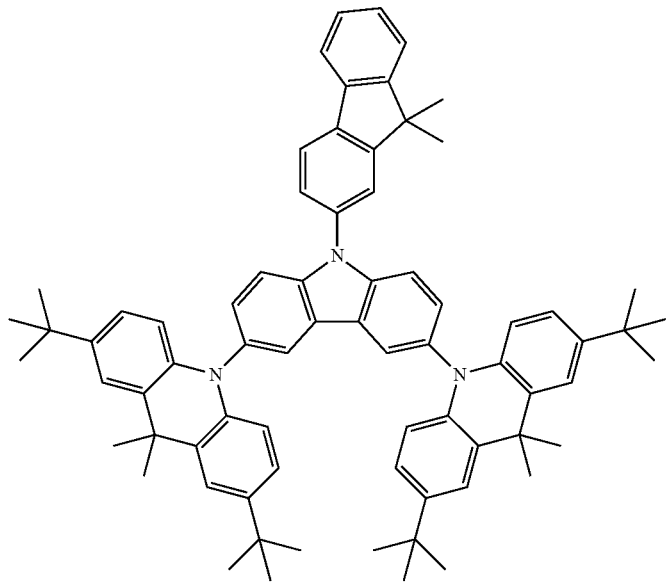
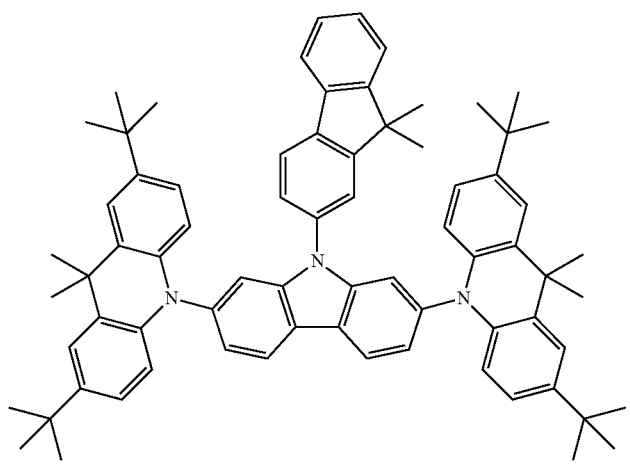
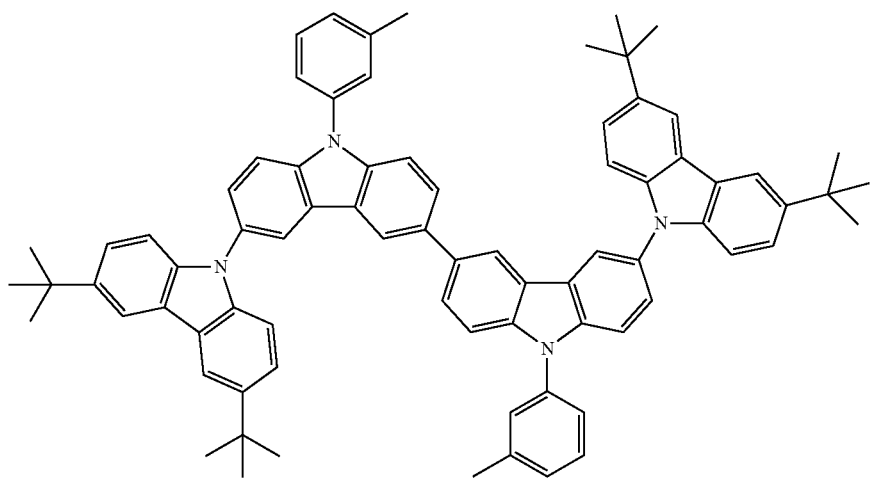

-continued

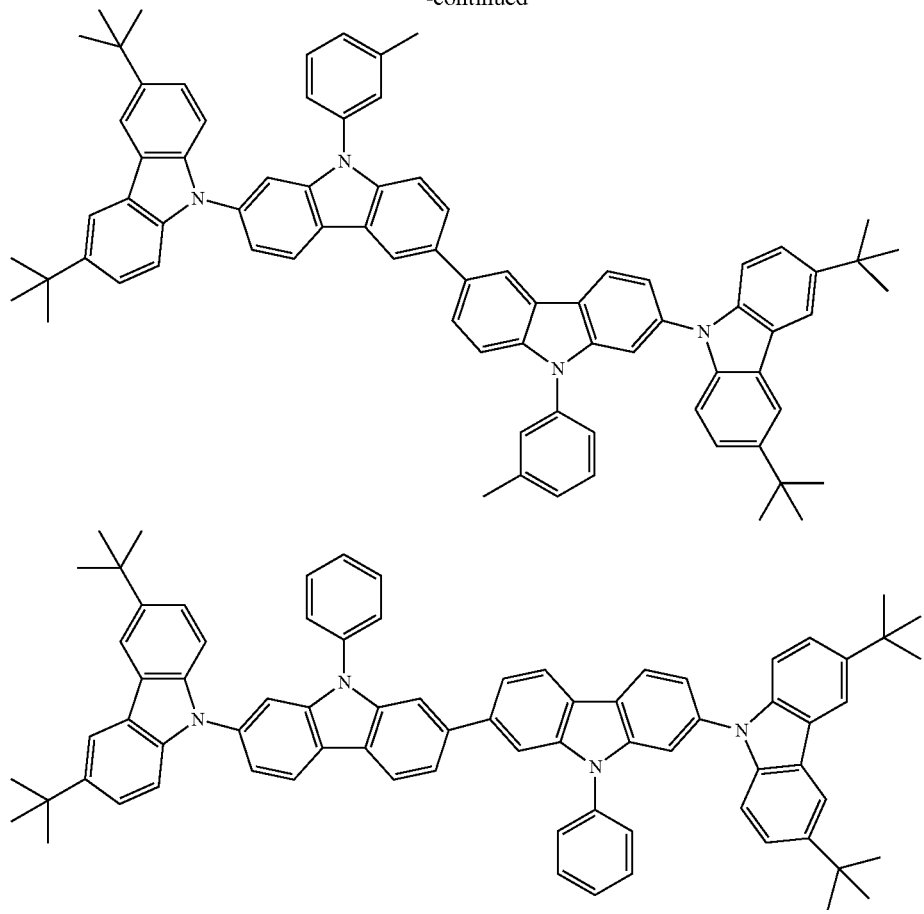

An inorganic material may be used as the electron blocking layer 3. In general, the dielectric constant of an inorganic material is larger than that of an organic material, and therefore, when the inorganic material is used for the electron blocking layer 3, a large quantity of voltage is applied to the photoelectric conversion layer 4, thereby enabling to increase the photoelectric conversion efficiency. Examples of the material that may form the electron blocking layer 3 include calcium oxide, chromium oxide, chromiumcopper oxide, manganese oxide, cobalt oxide, nickel oxide, copper oxide, galliumcopper oxide, strontiumcopper oxide, niobium oxide, molybdenum oxide, indiumcopper oxide, indiumsilver oxide, iridium oxide and the like.

In the case where the electron blocking layer 3 is a single layer, the layer may be formed of an inorganic material, and in the case where the electron blocking layer is formed of a plurality of layers, one or two or more layers may be formed of an inorganic material.

[Pixel Electrode]

Examples of the material of the electrode 2 (pixel electrode 104) include metal, metal oxides, metal nitrides, metal borides, an organic conductive compound, a mixture thereof and the like. Specific examples thereof include conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag), chromium (Cr), nickel (Ni), aluminum (Al), mixtures or laminates of the metals and the conductive metal oxides, organic conductive compounds such as polyaniline, polythiophene, and polypyrrole, laminates of the organic conductive compounds and ITO and the like. Particularly preferable examples of the material of the transparent conductive film include any one material of ITO, IZO, TiN, tin oxides, antimony-doped tin oxides (ATO), fluorine-doped tin oxides (FTO), zinc oxides, antimony-doped zinc oxides (AZO) and gallium-doped zinc oxides (GZO).

If the step corresponding to the film thickness of the electrode 2 is steeply inclined at an end of the electrode 2, or a significant unevenness is formed on the surface of the electrode 2, or fine dust (particles) is attached on the electrode 2, the layer on the electrode 2 may become thinner than desired, or cracks may occur. If the electrode 5 (counter electrode 108) is formed in such a state on the layer, pixel inferiority such as an increase in dark current or a short-circuit is caused by concentration of electric field or by contact of the electrode 2 and the electrode 5 at a defective portion. Further, the above defects may reduce an adhesion between the electrode 2 and the layer thereon or heat resistance of the organic photoelectric conversion device 10.

It is preferred that surface roughness Ra of the electrode 2 is 0.6 nm or less in order to prevent the defects from occurring to improve reliability of the device. Low surface roughness Ra of the electrode 2 means a small unevenness of the surface and favorable surface flatness. Further, in order to remove particles on the electrode 2, it is particularly preferred that the substrate is washed by a general washing technology used in the manufacturing process of the semiconductor before the electron blocking layer 3 is formed.

[Counter Electrode]

Examples of the material of the electrode 5 (counter electrode 108) may include metal, metal oxides, metal nitrides, metal borides, an organic conductive compound, a mixture thereof and the like. Specific examples thereof may include conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag), chromium (Cr), nickel (Ni), aluminum (Al), and mixtures or laminates of the metals and the conductive metal oxides, organic conductive compounds such as polyaniline, polythiophene, and polypyrrole, laminates of the organic conductive compounds and ITO and the like. The material of the transparent conductive film is particularly preferably any material of ITO, IZO, tin oxides, antimony-doped tin oxides (ATO), fluorine-doped tin oxides (FTO), zinc oxides, antimony-doped zinc oxides (AZO) and gallium-doped zinc oxides (GZO).

[Passivation Layer]

The following conditions are required for the passivation layer 6 (passivation layer 110).

First, the photoelectric conversion layer needs to be protected by preventing permeation of factors deteriorating the organic photoelectric conversion material included in a solution, a plasma and the like in each manufacturing process of the device.

Second, after the device is manufactured, the photoelectric conversion layer 4 needs to be prevented from being deteriorated during storage and use for a long period of time by preventing permeation of factors deteriorating the organic photoelectric conversion material such as water molecules.

Third, when the passivation layer 6 is formed, the photoelectric conversion layer formed prior thereto needs to be prevented from being deteriorated.

Fourth, since incident light reaches the photoelectric conversion layer 4 through the passivation layer 6, the passivation layer 6 needs to be transparent to light having a wavelength detected in the photoelectric conversion layer 4.

The passivation layer 6 may be constituted by a film made of a single material, but by having a multilayered structure to provide different functions for each of the layers, it is possible to expect effects such as a stress relaxation of the entire passivation layer 6, suppression of generation of defects such as cracks and pinholes due to dust emissions during the manufacturing process, and easy optimization of material development, and the like. For example, the passivation layer 6 may have a double-layered structure where a "passivation auxiliary layer" is stacked on a layer that is used for the original purpose of preventing permeation of deterioration factors such as water molecules, and the passivation auxiliary layer has a function that is difficult to be accomplished by the layer. A constitution of three or more layers is feasible, but the number of layers is preferably as small as possible, in consideration of manufacturing cost.

[Formation of the Passivation Layer 6 by the Atomic Layer Deposition Method]

The performance of the organic photoelectric conversion material is significantly deteriorated due to the deterioration factors such as water molecules. Accordingly, it is required to cover and seal the entire photoelectric conversion layer by ceramics such as dense metal oxides, metal nitrides, and metal oxynitrides or diamond type carbon (DLC) which does not allow water molecules to permeate. In the related art, aluminum oxide, silicon oxide, silicon nitride, silicon oxynitride, a stacked constitution thereof, or a stacked constitution of these and an organic polymer are used to form the passivation layer by various vacuum film-forming technologies. However, in the conventional passivation layer, a step by a structure on the surface of the substrate, fine defects on the surface of the substrate, and particles attached to the surface of the substrate makes it difficult to grow a thin film (because the step becomes a shadow), and accordingly, the film thickness is significantly decreased as compared to a flat portion. As a result, the step portion becomes a path through which the deterioration factors permeate. In order to completely cover the step by the passivation layer, the entire passivation layer needs to be made thick by forming the film to have the thickness of 1 μm or more in the flat portion.

In the imaging device 100 having a pixel dimension of less than 2 μm, and particularly about 1 μm, if a distance between the color filter 111 and the photoelectric conversion layer, that is, the thickness of the passivation layer 110, is large, incident light is diffracted or diverged in the passivation layer 110, thus causing color mixing. Accordingly, the imaging device 100 having the pixel dimension of about 1 μm needs to be manufactured by using a passivation layer material/manufacturing method in which device performance is not deteriorated even when the thickness of the entire passivation layer 110 is reduced.

The atomic layer deposition (ALD) method is a kind of CVD method and a technology of forming a thin film by alternately repeating adsorption/reaction of an organometallic compound molecule, a metal halide molecule, and a metal hydride molecule that are a thin film material, to the surface of the substrate, and decomposition of unreacted groups included therein. When the thin film material reaches the surface of the substrate, the film material is in a low molecular state, and thus, if there is a very small space which allows low molecules to enter, it is possible to grow the thin film. Accordingly, the step portion is completely covered (the thickness of the thin film grown in the step portion is the same as the thickness of the thin film grown in the flat portion) that is considered a difficulty in the conventional thin film forming method, and as a result a step coverage property is very excellent. Accordingly, as the step caused by a structure on the surface of the substrate, fine defects on the surface of the substrate, and particles attached to the surface of the substrate may be completely covered, the step portion does not become a path through which the deterioration factors of the photoelectric conversion material permeate. In the case where the passivation layer 6 is formed by the atomic layer deposition method, the thickness of the passivation layer can be reduced in a required manner more effectively than the conventional technology.

In the case where the passivation layer 6 is formed by the atomic layer deposition method, the material corresponding to the ceramics preferable to the passivation layer 6 may be selected appropriately. However, since the photoelectric conversion layer of the present invention uses the organic photoelectric conversion material, the material of the photoelectric conversion layer is limited to the material which can be grown to form the thin film at a relatively low temperature at which the organic photoelectric conversion material is not deteriorated. According to the atomic layer deposition method using alkylaluminum or halogenated aluminum as the material, the dense aluminum oxide thin film may be formed at a temperature of less than 200° C. at which the organic photoelectric conversion material is not deteriorated. Particularly, in the case where trimethylaluminum is used, the aluminum oxide thin film may be formed even at about 100° C., thereby being preferable. Silicon oxide or titanium oxide may also preferably form the dense thin film at a temperature of less than 200° C. by appropriately selecting the material as in aluminum oxide.

[Passivation Auxiliary Layer]

The thin film formed by the atomic layer deposition method may be an unprecedented, to obtain a high-quality thin film at low temperatures from the viewpoint of step coverage and denseness properties. However, physical properties of the material of the thin film may be deteriorated in some cases by chemicals used in a photolithography process. For example, since the aluminum oxide thin film formed by the atomic layer deposition method is amorphous, the surface thereof is eroded by an alkali solution such as a developing solution or a stripping solution. In this case, the thin film having excellent chemical resistance needs to be formed on the aluminum oxide thin film formed by the atomic layer deposition method, that is, a passivation auxiliary layer is required as a functional layer for protecting the passivation layer 6.

Meanwhile, there are many cases where the thin film formed by a CVD method such as the atomic layer deposition method has tensile stress having very high internal stress, thus, there is a case where deterioration such as cracks in the thin film occurs by a process of repeating intermittent heating and cooling or by storage/use in a high temperature/high humidity atmosphere for a long period of time like the process of manufacturing the semiconductor.

In order to overcome the problem of the passivation layer 6 formed by the atomic layer deposition method as described above, for example, it is preferable to form the passivation auxiliary layer including any one of ceramics such as metal oxides, metal nitrides and metal oxynitrides having excellent chemical resistance, which is formed by a physical vapor deposition (PVD) method such as a sputtering method. Herein, the passivation layer, which is formed by the atomic layer deposition method, is a first passivation layer, and the passivation layer, which is formed on the first passivation layer by the PVD method and includes any one of metal oxides, metal nitrides and metal oxynitrides, is a second passivation layer. Thereby, it is easy to improve chemical resistance of the entire passivation layer 6. Further, since there are many cases where the ceramic film formed by the PVD method such as the sputtering method has high compression stress, tensile stress of the first passivation layer formed by the atomic layer deposition method may be offset. Therefore, stress of the entire passivation layer 6 is relaxed, such that reliability of the passivation layer 6 is increased, and it is possible to significantly suppress occurrence of defects such as deterioration of performance or breakage of the photoelectric conversion layer and the like by stress of the passivation layer 6.

Particularly, it is preferred to have a constitution where the second passivation layer which is formed by the sputtering method and includes any one of aluminum oxides, silicon oxides, silicon nitrides and silicon oxynitrides is provided on the first passivation layer.

It is preferred that the first passivation layer has a thickness of 0.05 µm to 0.2 µm. Further, it is preferred that the first passivation layer includes any one of aluminum oxides, silicon oxides and titanium oxides.

EXAMPLE

Example 1

Example 1 was the photoelectric conversion device constituted by the lower electrode/electron blocking layer/photoelectric conversion layer/upper electrode/passivation layer. The electron blocking layer, the photoelectric conversion layer, the upper electrode and the passivation layer were sequentially formed. The lower electrode was TiN. The electron blocking layer was formed in a thickness of 100 nm by depositing the organic compound represented by Compound 1 in the degree of vacuum of $5.0 \times 10^{-4}$ Pa or less at a deposition rate of 2 Å/sec by a vacuum deposition method. The photoelectric conversion layer was formed in a thickness of 400 nm by co-depositing the mixed film of the organic compound represented by Compound 2 and fullerene $C_{60}$ (Compound 2: $C_{60}$=1:2 (volume ratio)) in a vacuum of $5.0 \times 10^{-4}$ Pa or less at a deposition rate of 4 Å/sec. The upper electrode was formed of ITO in a thickness of 10 nm by a high frequency magnetron sputter. The passivation layer was formed of the stacked layer of silicon monoxide, aluminum oxide and silicon nitride. The film of silicon monoxide was formed in a thickness of 100 nm by vacuum deposition. The film of aluminum oxide was formed by using the atomic layer deposition apparatus in a thickness of 200 nm. The film of silicon nitride was formed by the magnetron sputter in a thickness of 100 nm.

Example 2

The same operation as in Example 1 was performed to manufacture a photoelectric conversion device of Example 2, except that Compound 1 of Example 1 was changed to compound 3.

Example 3

The same operation as in Example 1 was performed to manufacture a photoelectric conversion device of Example 3, except that Compound 1 of Example 1 was changed to Compound 4.

Example 4

The same operation as in Example 1 was performed to manufacture a photoelectric conversion device of Example 4, except that the photoelectric conversion layer of Example 1 was changed to the mixed film of the organic compound represented by Compound 2 and fullerene $C_{60}$ (Compound 2: $C_{60}$=1:3 (volume ratio)).

Example 5

The same operation as in Example 3 was performed to manufacture a photoelectric conversion device of Example 5, except that the photoelectric conversion layer of Example 3 was changed to the mixed film of the organic compound represented by Compound 7 and fullerene $C_{60}$ (Compound 7: $C_{60}$=1:2 (volume ratio)).

Example 6

The same operation as in Example 3 was performed to manufacture a photoelectric conversion device of Example 6, except that the photoelectric conversion layer of Example 3 was changed to the mixed film of the organic compound represented by Compound 8 and fullerene $C_{60}$ (Compound 8: $C_{60}$=1:2 (volume ratio)).

Example 7

The same operation as in Example 1 was performed to manufacture a photoelectric conversion device of Example 7, except that the photoelectric conversion layer of Example 1 was changed to the mixed film of the organic compound represented by Compound 13 and fullerene $C_{60}$ (Compound 13: $C_{60}$=1:2 (volume ratio)).

Comparative Example 1

The same operation as in Example 1 was performed to manufacture a photoelectric conversion device of Comparative Example 1, except that Compound 1 of Example 1 was changed to Compound 5.

Comparative Example 2

The same operation as in Example 1 was performed to manufacture a photoelectric conversion device of Comparative Example 2, except that Compound 1 of Example 1 was changed to Compound 6.

Comparative Example 3

The same operation as in Example 1 was performed to manufacture a photoelectric conversion device of Comparative Example 3, except that the photoelectric conversion layer of Example 1 was changed to the mixed film of the organic compound represented by Compound 9 and fullerene $C_{60}$ (Compound 9: $C_{60}$=1:2 (volume ratio)).

Comparative Example 4

The same operation as in Example 3 was performed to manufacture a photoelectric conversion device of Comparative Example 4, except that the photoelectric conversion layer of Example 3 was changed to the mixed film of the organic compound represented by Compound 10 and fullerene $C_{60}$ (Compound 10: $C_{60}$=1:2 (volume ratio)).

Comparative Example 5

The same operation as in Example 1 was performed to manufacture a photoelectric conversion device of Comparative Example 5, except that the photoelectric conversion layer of Example 1 was changed to the mixed film of the organic compound represented by Compound 11 and fullerene $C_{60}$ (Compound 11: $C_{60}$=1:2 (volume ratio)).

Comparative Example 6

The same operation as in Example 1 was performed to manufacture a photoelectric conversion device of Comparative Example 6, except that the photoelectric conversion layer of Example 1 was changed to the mixed film of the organic compound represented by Compound 12 and fullerene $C_{60}$ (Compound 12: $C_{60}$=1:2 (volume ratio)).

Compounds 1 to 13 used in Examples and Comparative Examples are shown below.

[Chem. 12]

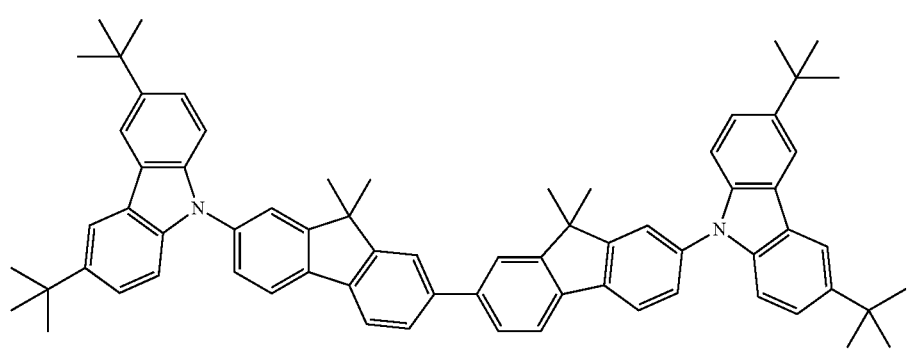

1

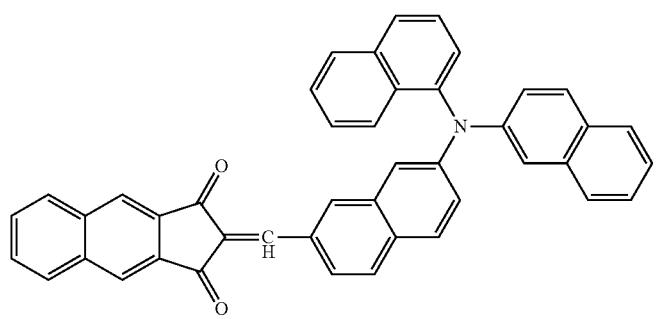

2

-continued
3
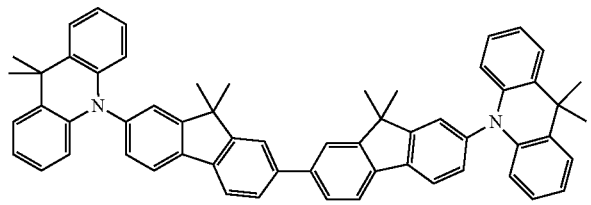
4
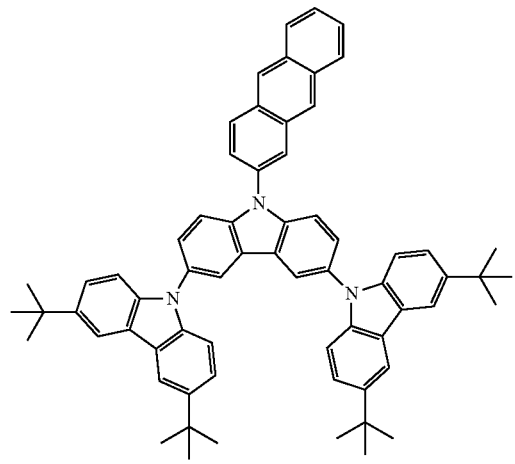
5
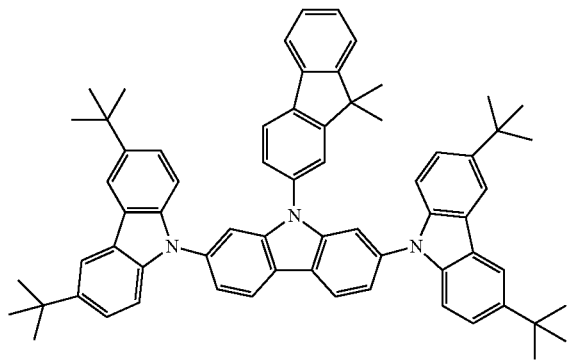
6
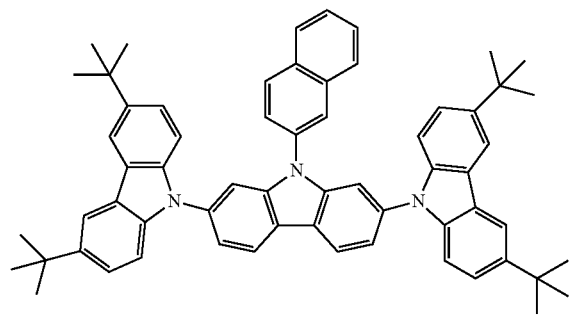
7
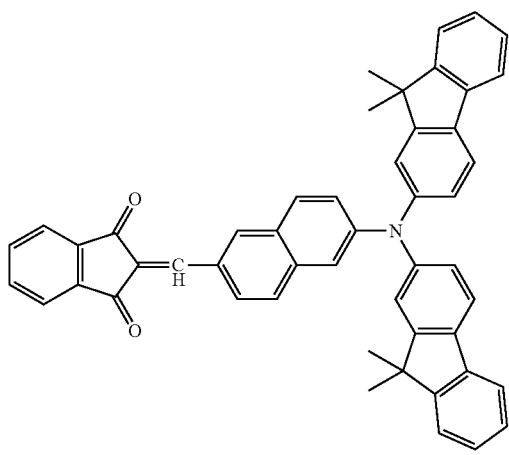
8
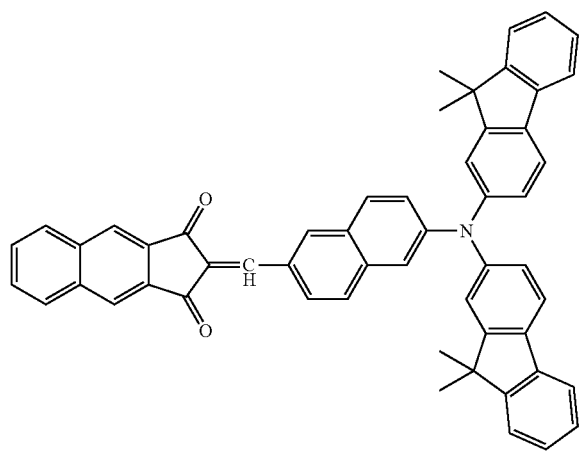
9
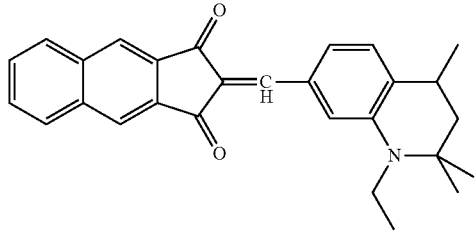
10
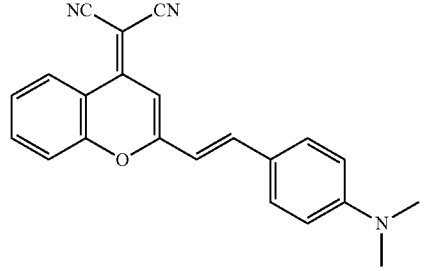

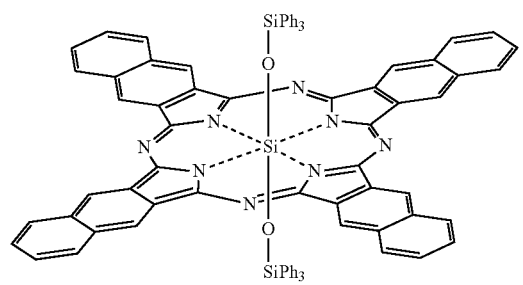

[Chem. 13]

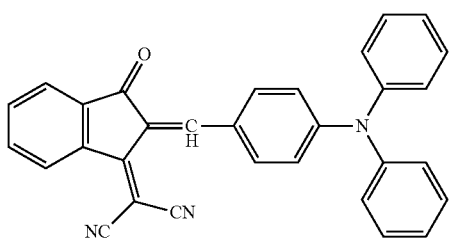

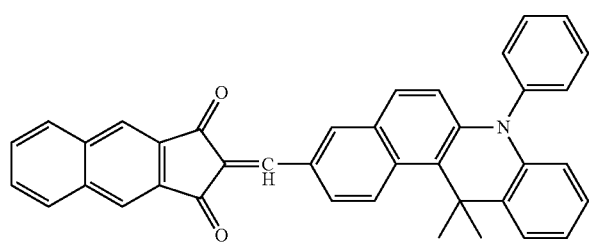

The ionization potential (Ip) values of the layers manufactured by using each material are described in Table 3.

Ip of each layer was measured by using the AC-2 surface analysis apparatus manufactured by Rikenkeiki, Co., Ltd. The film of the organic material was formed in a thickness of about 100 nm on the quartz substrate, and the measurement was performed in a light quantity of 5 nW to 50 nW.

TABLE 3

| | Ip |
|---|---|
| Compound 1 | 5.65 eV |
| Compound 2 + C60 (1:2) | 5.5 eV |
| Compound 2 + C60 (1:3) | 5.54 eV |
| Compound 3 | 5.65 eV |
| Compound 4 | 5.56 eV |
| Compound 5 | 5.25 eV |
| Compound 6 | 5.3 eV |
| Compound 7 + C60 (1:2) | 5.4 eV |
| Compound 8 + C60 (1:2) | 5.32 eV |
| Compound 9 + C60 (1:2) | 5.15 eV |
| Compound 10 + C60 (1:2) | 5.14 eV |
| Compound 11 + C60 (1:2) | 5.15 eV |
| Compound 12 + C60 (1:2) | 5.63 eV |
| Compound 13 + C60 (1:2) | 5.54 eV |

The temperature of the manufactured device was controlled to 30° C., 40° C., 60° C. and 65° C. in a state where a plus bias of 2.0 E+5 V/cm (2.0×10$^5$ V/cm) was applied to the upper electrode to measure the dark current and external quantum efficiency. Further, after the dark current and external quantum efficiency were measured, the light resistance test was performed by irradiating white light of 1,000 lux on the device for 1,000 hours. After the light resistance test was performed, external quantum efficiency was measured in a state where the plus bias of 2.0 E+5 V/cm was applied again to the upper electrode. The dark current was measured by the source meter (6430 manufactured by Keithley, Co., Ltd.) in a state where the plus bias of 2.0 E+5 V/cm was applied to the upper electrode and the device was light-shielded. External quantum efficiency was obtained by measuring a photocurrent flowing when light was irradiated on the device where the plus bias of 2.0 E+5 V/cm was applied to the upper electrode while white light was set to monochromic light by a spectrometer using a xenon lamp (L2195 manufactured by Hamamatsu Photonics, K.K.) as a light source and light quantity was controlled by an ND filter.

The dark current values at 30° C., 40° C., 60° C. and 65° C., the difference between dark current values at 60° C. and 65° C. (current value difference) and external quantum efficiency of each device at the maximum absorption wavelength before and after the light resistance test was performed are described in Table 4.

TABLE 4

| | Ionization potential | | External quantum efficiency | | Dark current (A/cm$^2$) | | | | Difference between current values (A/(cm$^2$ × 5° C.)) Δ |
|---|---|---|---|---|---|---|---|---|---|
| | Photoelectric conversion layer | Electron blocking layer | Before light resistance test | After light resistance test | 30° C. | 40° C. | 60° C. | 65° C. | (@65° C.-@60° C.) |
| Example 1 | 5.5 eV | 5.65 eV | 75% | 75% | 7.9E−11 | 9.9E−11 | 1.50E−10 | 1.67E−10 | 1.70E−11 |
| Example 2 | 5.5 eV | 5.65 eV | 75% | 75% | 8.5E−11 | 1.07E−10 | 1.52E−10 | 1.73E−10 | 2.10E−11 |
| Example 3 | 5.5 eV | 5.56 eV | 75% | 75% | 1.3E−10 | 1.62E−10 | 2.45E−10 | 2.87E−10 | 4.20E−11 |
| Example 4 | 5.54 eV | 5.65 eV | 73% | 73% | 9.1E−11 | 1.14E−10 | 1.40E−10 | 1.55E−10 | 1.50E−11 |
| Example 5 | 5.4 eV | 5.56 eV | 77% | 77% | 1.9E−10 | 2.17E−10 | 2.74E−10 | 3.15E−10 | 4.10E−11 |

TABLE 4-continued

| | Ionization potential | | External quantum efficiency | | Dark current (A/cm$^2$) | | | | Difference between current values (A/(cm$^2$ × 5° C.)) Δ |
|---|---|---|---|---|---|---|---|---|---|
| | Photoelectric conversion layer | Electron blocking layer | Before light resistance test | After light resistance test | 30° C. | 40° C. | 60° C. | 65° C. | (@65° C.-@60° C.) |
| Example 6 | 5.32 eV | 5.56 eV | 73% | 73% | 2.2E−10 | 2.54E−10 | 2.88E−10 | 3.11E−10 | 2.30E−11 |
| Example 7 | 5.54 eV | 5.65 eV | 78% | 78% | 8.7E−11 | 1.14E−10 | 1.44E−10 | 1.62E−10 | 1.80E−11 |
| Comparative Example 1 | 5.5 eV | 5.25 eV | 75% | 75% | 1.36E−10 | 3.55E−10 | 2.10E−09 | 3.13E−09 | 1.03E−09 |
| Comparative Example 2 | 5.5 eV | 5.3 eV | 75% | 75% | 7.9E−11 | 2.03E−10 | 1.42E−09 | 1.98E−09 | 5.60E−10 |
| Comparative Example 3 | 5.15 eV | 5.65 eV | 70% | 70% | 1.80E−10 | 3.9E−10 | 3.00E−09 | 4.32E−09 | 1.32E−09 |
| Comparative Example 4 | 5.14 eV | 5.56 eV | 63% | 63% | 3.20E−10 | 5.15E−10 | 3.11E−09 | 4.24E−09 | 1.13E−09 |
| Comparative Example 5 | 5.15 eV | 5.65 eV | 51% | 51% | 8.37E−10 | 1.32E−09 | 3.52E−09 | 4.62E−09 | 1.10E−09 |
| Comparative Example 6 | 5.63 eV | 5.65 eV | 40% | 22% | 9.5E−11 | 1.33E−10 | 1.82E−10 | 2.25E−10 | 4.30E−11 |

In Examples 1 to 7, as the ionization potential of the photoelectric conversion layer is 5.2 eV to 5.6 eV and the ionization potential of the electron blocking layer is higher than the ionization potential of the photoelectric conversion layer, high photoelectric conversion efficiency is obtained, with no reduction in efficiency even after the light resistance test was performed, and the dark current in the temperature range of 30° C. to 65° C. is sufficiently low. In Comparative Examples 1 and 2, as the ionization potential of the electron blocking layer is lower than the ionization potential of the photoelectric conversion layer, electric charges are generated at an interface between the photoelectric conversion layer and the electron blocking layer, such that the dark current is largely increased with the increase of temperatures. In Comparative Examples 3, 4 and 5, since the ionization potential of the photoelectric conversion layer is lower than 5.2 eV, electric charges are generated from the photoelectric conversion layer, such that the dark current is largely increased with the increase of temperatures. In Comparative Example 6, as the ionization potential of the electron blocking layer is higher than the ionization potential of the photoelectric conversion layer and the ionization potential of the photoelectric conversion layer is 5.2 eV or more, the dark current is low, but the ionization potential of the photoelectric conversion layer is higher than 5.6 eV, and accordingly, external quantum efficiency is low before the light resistance test, and sensitivity is further reduced after the light resistance test.

As described above, in the organic photoelectric conversion device where the electron blocking layer and the photoelectric conversion layer are stacked on the electrode, it was found that the organic photoelectric conversion device serving as a photoelectric conversion device having high photoelectric conversion efficiency, having a small absolute value of dark current, and exhibiting favorable properties at room temperature to 60° C. can be realized by designing the device such that the photoelectric conversion layer is a bulk hetero layer where the fullerene or the fullerene derivative and the p-type organic semiconductor material are mixed, the ionization potential of the photoelectric conversion layer is 5.2 eV to 5.6 eV, and the ionization potential of the electron blocking layer is higher than the ionization potential of the photoelectric conversion layer adjacent thereto.

INDUSTRIAL APPLICABILITY

According to the present invention, there may be provided a photoelectric conversion device serving as a photoelectric conversion device having high photoelectric conversion efficiency, exhibiting a low dark current, having excellent light resistance, and capable of reducing an increase of a dark current caused by an increase in temperature, and an imaging device including the photoelectric conversion device.

The present invention has been described in detail with reference to specific embodiments, but it is apparent to the person with ordinary skill in the art that various changes or modifications may be made without departing from the spirit and the scope of the present invention.

This application is based on Japanese Patent Application No. 2010-084407 filed on Mar. 31, 2010 and Japanese Patent Application No. 2010-249209 filed on Nov. 5, 2010, and the contents of which are herein incorporated by reference.

REFERENCE SIGNS LIST

10: Organic photoelectric conversion device
1: Substrate
2: Electrode
3: Electron blocking layer
4: Photoelectric conversion layer
5: Electrode
6: Passivation layer
100: Imaging device

The invention claimed is:

1. A photoelectric conversion device comprising:
a pair of electrodes; and
a photoelectric conversion layer interposed between the pair of electrodes,
wherein the photoelectric conversion layer is a bulk hetero layer where a fullerene or a fullerene derivative and a p-type organic semiconductor material are mixed,
an ionization potential of the photoelectric conversion layer is 5.2 eV to 5.6 eV,
at least one electron blocking layer is provided between at least one of the pair of electrodes and the photoelectric conversion layer, and
the ionization potential of the electron blocking layer adjacent to the photoelectric conversion layer is higher than the ionization potential of the photoelectric conversion layer.

2. The photoelectric conversion device according to claim 1,
wherein the p-type organic semiconductor material is a compound represented by the following Formula (1):

Formula (1)

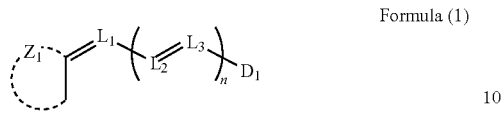

wherein $Z_1$ is a ring including at least two carbon atoms and represents a 5-membered ring, a 6-membered ring, or a condensed ring including at least one of the 5-membered ring and the 6-membered ring,
each of $L_1$, $L_2$ and $L_3$ independently represents a unsubstituted methine group or a substituted methine group,
$D_1$ represents an atom group,
n represents an integer of 0 or more.

3. The photoelectric conversion device according to claim 1,
wherein the pair of electrodes include a conductive film and a transparent conductive film, and
the conductive film, the electron blocking layer, the photoelectric conversion layer and the transparent conductive film are stacked in this order.

4. A photosensor comprising:
the photoelectric conversion device according to claim 1.

5. An imaging device comprising:
the photoelectric conversion device according to claim 1.

* * * * *